United States Patent
Kim et al.

(10) Patent No.: US 12,419,040 B2
(45) Date of Patent: Sep. 16, 2025

(54) SEMICONDUCTOR DEVICE WITH BIT-LINE STRUCTURE OVER CELL REGION ISOLATION FILM

(71) Applicant: Samsung Electronics Co., Ltd., Suwon-si (KR)

(72) Inventors: Seok Hyun Kim, Incheon (KR); Young Sin Kim, Hwaseong-si (KR); Dong Sik Park, Suwon-si (KR); Jong Min Lee, Hwaseong-si (KR); Joon Yong Choe, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 990 days.

(21) Appl. No.: 17/515,888

(22) Filed: Nov. 1, 2021

(65) Prior Publication Data

US 2022/0271044 A1    Aug. 25, 2022

(30) Foreign Application Priority Data

Feb. 19, 2021   (KR) .................. 10-2021-0022534

(51) Int. Cl.
   *H10B 12/00*    (2023.01)
   *H01L 21/768*   (2006.01)
   *H10D 30/01*    (2025.01)

(52) U.S. Cl.
   CPC ..... *H10B 12/482* (2023.02); *H01L 21/76831* (2013.01); *H10B 12/50* (2023.02); *H10D 30/0293* (2025.01)

(58) Field of Classification Search
   CPC .... H10B 12/482; H10B 12/50; H10B 12/485; H10B 12/09; H10B 12/34; H10B 12/053; H10B 12/315; H01L 21/76831; H01L 23/53295; H01L 23/5283; H01L 23/535; H01L 23/5386; H10D 30/0293; H10D 18/60; A23B 2/783; H10F 39/193; H10H 20/8314

See application file for complete search history.

(56) References Cited

U.S. PATENT DOCUMENTS

| | | |
|---|---|---|
| 7,687,342 B2 | 3/2010 | Haller et al. |
| 8,445,350 B2 | 5/2013 | Han |
| 8,614,509 B2 | 12/2013 | Kim |
| 9,082,647 B2 | 7/2015 | Jang et al. |
| 9,768,176 B2 | 9/2017 | Yoo |

(Continued)

FOREIGN PATENT DOCUMENTS

KR    20200115762 A    10/2020

*Primary Examiner* — John P. Dulka
(74) *Attorney, Agent, or Firm* — Wolf, Greenfield & Sacks, P.C.

(57) ABSTRACT

A semiconductor device comprises a substrate comprising a cell region; a cell region isolation film in the substrate and extending along an outer edge of the cell region; a bit-line structure on the substrate and in the cell region, wherein the bit-line structure has a distal end positioned on the cell region isolation film; a cell spacer on a vertical side surface of the distal end of the bit-line structure; an etching stopper film extending along a side surface of the cell spacer and a top face of the cell region isolation film; and an interlayer insulating film on the etching stopper film, and on the side surface of the cell spacer, wherein the interlayer insulating film includes silicon nitride.

20 Claims, 14 Drawing Sheets

(56) References Cited

U.S. PATENT DOCUMENTS

| | | |
|---|---|---|
| 9,947,668 B2 | 4/2018 | Lee et al. |
| 10,504,912 B2 | 12/2019 | Shu et al. |
| 2011/0309435 A1 | 12/2011 | Hwang et al. |
| 2012/0012911 A1* | 1/2012 | Jeong .................. H10B 12/482 257/330 |
| 2018/0350905 A1* | 12/2018 | Yoon ...................... H10B 12/09 |
| 2020/0312845 A1* | 10/2020 | Yoon ...................... H10D 84/85 |
| 2021/0098460 A1* | 4/2021 | Lee ....................... H10B 12/053 |

* cited by examiner

SEMICONDUCTOR DEVICE WITH BIT-LINE STRUCTURE OVER CELL REGION ISOLATION FILM

CROSS-REFERENCE TO RELATED APPLICATION

This application claims priority from Korean Patent Application No. 10-2021-0022534, filed on Feb. 19, 2021 in the Korean Intellectual Property Office, and all the benefits accruing therefrom under 35 U.S.C. § 119, the contents of which in its entirety are herein incorporated by reference.

FIELD

The present disclosure relates to a semiconductor device.

BACKGROUND

Semiconductor devices may have increasingly higher degrees or levels of integration. Thus, in order to implement more semiconductor elements in the same area, individual circuit patterns may be increasingly smaller. In other words, as the integration level of the semiconductor device increases, a design rule for components of the semiconductor device is decreasing.

In a highly scaled semiconductor device, a process of forming a plurality of wire lines and a plurality of buried contacts (BC) interposed between the lines may become increasingly complex and difficult.

SUMMARY

A technical purpose of the present disclosure is to provide a semiconductor device that may have improved reliability and performance.

Purposes in accordance with the present disclosure are not limited to the above-mentioned purpose. Other purposes and advantages in accordance with the present disclosure as not mentioned above may be understood from following descriptions and more clearly understood from embodiments in accordance with the present disclosure. Further, it will be readily appreciated that the purposes and advantages in accordance with the present disclosure may be realized by features and combinations thereof as disclosed in the claims.

According to an aspect of the present inventive concept, there is provided a semiconductor device including: a substrate comprising a cell region; a cell region isolation film in the substrate and extending along an outer edge of the cell region; a bit-line structure on the substrate and in the cell region, wherein the bit-line structure has a distal end positioned on the cell region isolation film; a cell spacer on a vertical side surface of the distal end of the bit-line structure; an etching stopper film extending along a side surface of the cell spacer and a top face of the cell region isolation film; and an interlayer insulating film on the etching stopper film, and on the side surface of the cell spacer, wherein the interlayer insulating film comprises silicon nitride.

According to an aspect of the present inventive concept, there is provided a semiconductor device including: a substrate comprising a cell region and a peripheral area along a periphery of the cell region; a cell region isolation film in the substrate and extending along an outer edge of the cell region; a bit-line structure on the substrate and in the cell region, wherein the bit-line structure has a distal end positioned on the cell region isolation film; a peripheral gate structure on the substrate and in the peripheral area; an interlayer insulating film on the cell region isolation film and on the distal end of the bit-line structure; and an inserted insulating film disposed on the cell region isolation film, wherein the inserted insulating film is between the interlayer insulating film and the peripheral gate structure, wherein a side surface of the interlayer insulating film is in contact with the inserted insulating film and is convex toward the inserted insulating film.

According to an aspect of the present inventive concept, there is provided a semiconductor device including: a substrate comprising a cell region and a peripheral area along a periphery of the cell region; a cell region isolation film in the substrate and extending along an outer edge of the cell region to define the cell region; a gate electrode comprising at least a portion in the substrate and in the cell region, wherein the gate electrode extends in a first direction; a bit-line structure on the substrate and in the cell region, wherein the bit-line structure extends in a second direction intersecting the first direction, wherein the bit-line structure has a distal end on the cell region isolation film; a cell spacer on a side surface of the bit-line structure; a peripheral gate structure in the peripheral area and on the substrate, wherein the peripheral gate structure is spaced apart from the bit-line structure in the second direction; an etching stopper film extending along a side surface of the cell spacer, a top face of the cell region isolation film, and an outer face of the peripheral gate structure; and an interlayer insulating film on the etching stopper film and on the side surface of the cell spacer, wherein the interlayer insulating film extends into at least a portion of a space between the cell spacer and the peripheral gate structure, wherein the interlayer insulating film comprises silicon nitride.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
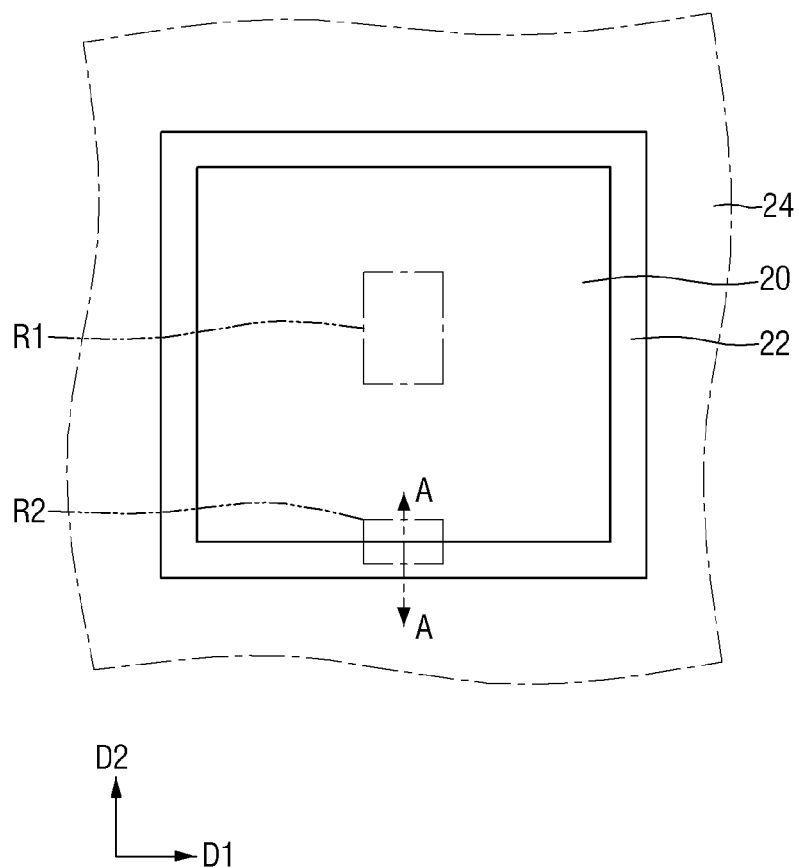
FIG. 1 is a schematic layout of a semiconductor device according to some implementations.

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing an embodiment of the present disclosure is provided by way of example only, and the present disclosure is not limited thereto.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter. That is, when elements are "directly" on or beneath or contacting or connected to or coupled to one another, no intervening elements are present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In descriptions of temporal relationships, for example, temporal precedent relationships between two events such as "after", "subsequent to", "before", etc., another event may occur therebetween unless "directly after", "directly subsequent" or "directly before" is indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

"D1 direction" and "D2 direction" should not be interpreted only to have a geometric relationship in which the D1 direction, and the D2 direction are perpendicular to each other. "D1 direction" and "D2 direction" may be interpreted to have a broader direction within a range in which components herein may work functionally.

Figure 2:
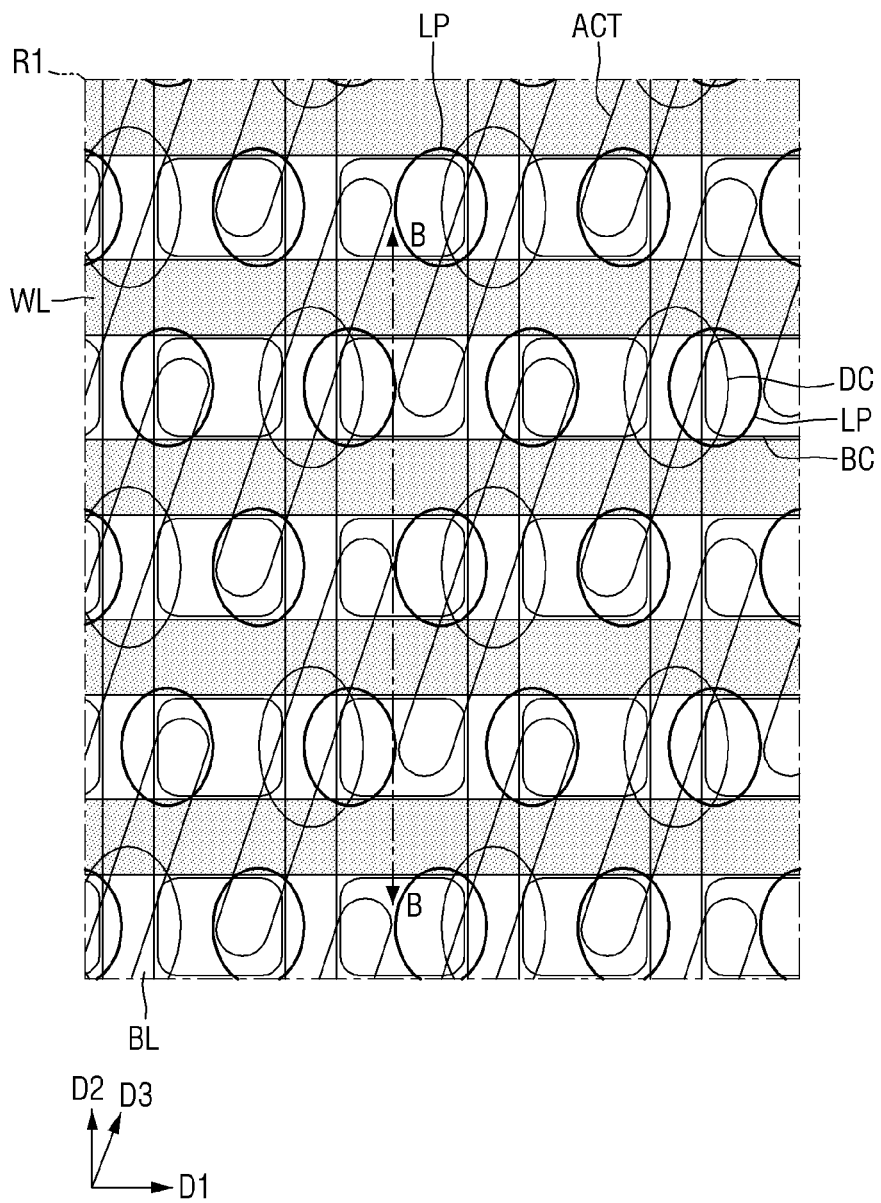
FIG. 2 is an enlarged schematic layout diagram of a R1 portion of FIG. 1.
Figure 3:
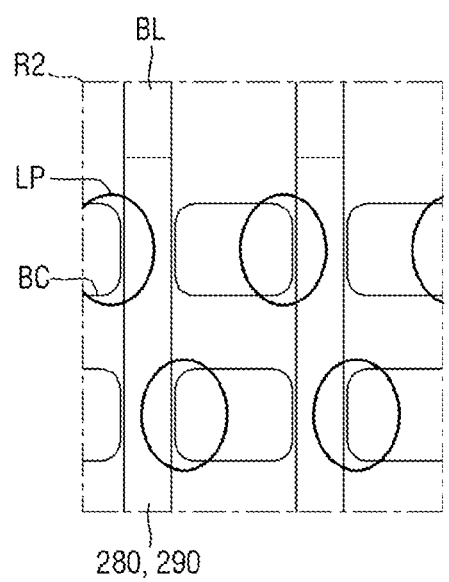
FIG. 3 is an enlarged schematic layout diagram showing a R2 portion of FIG. 1.
Figure 4:
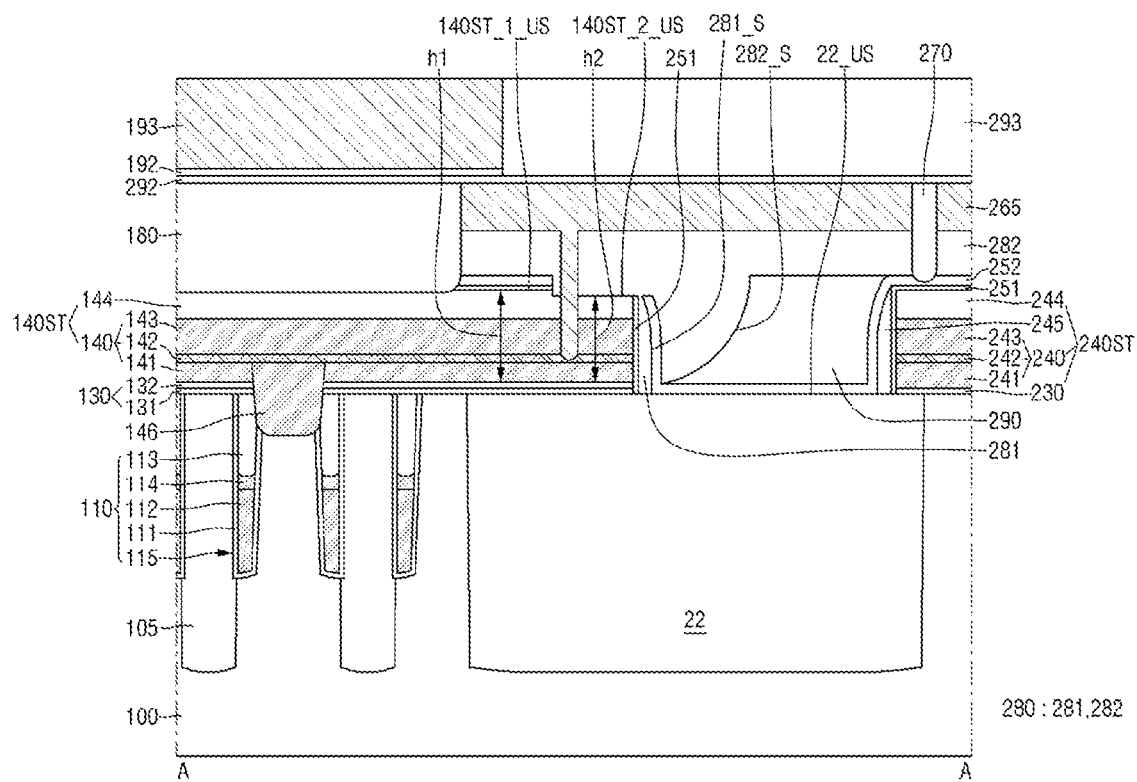
FIG. 4 is a cross-sectional view taken along a line A-A in FIG. 1.
Figure 5:
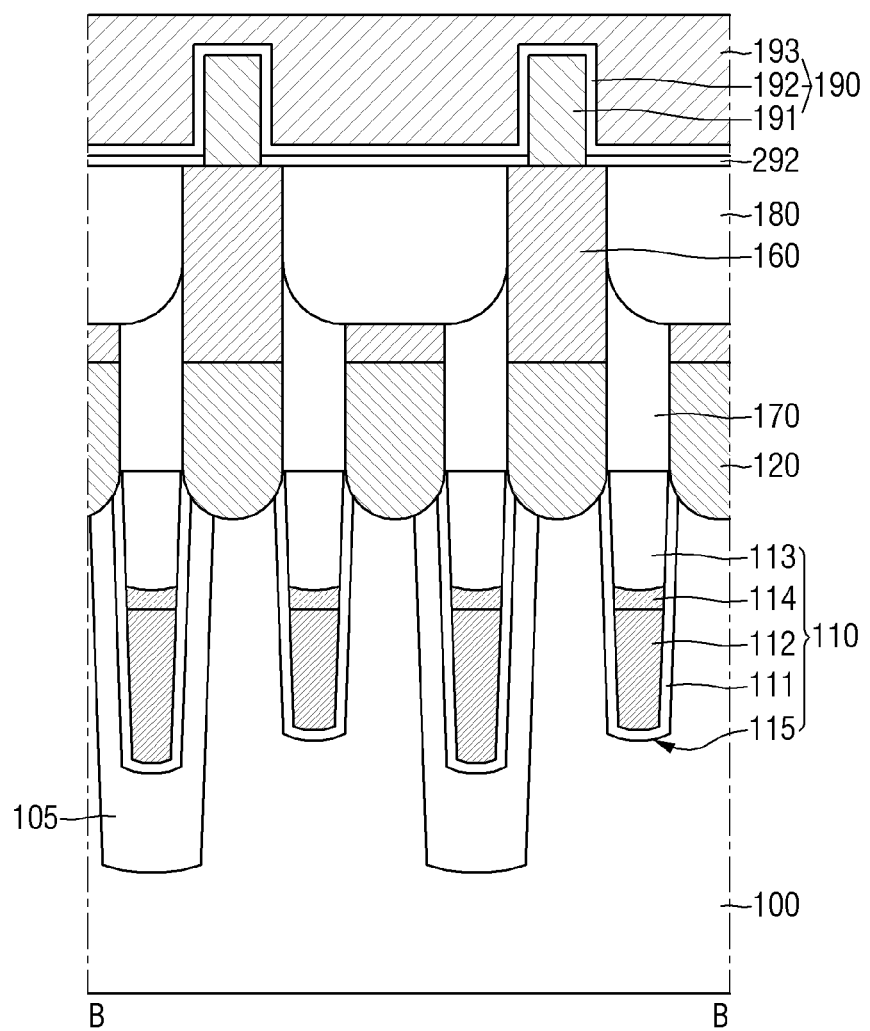
FIG. 5 is a cross-sectional view taken along a line B-B in FIG. 2.

FIG. 1 is a schematic layout of a semiconductor device according to some implementations. FIG. 2 is an enlarged schematic layout of a R1 portion of FIG. 1. FIG. 3 is an enlarged schematic layout diagram showing a R2 portion of FIG. 1. FIG. 4 is a cross-sectional view taken along a line A-A in FIG. 1. FIG. 5 is a cross-sectional view taken along a line B-B in FIG. 2.

For reference, FIG. 4 may be a cross-sectional view taken along a bit-line BL of FIGS. 2 and 3.

In a diagram of a semiconductor device according to some implementations, DRAM (Dynamic Random Access Memory) is illustrated by way of example. However, the present disclosure is not limited thereto.

Referring to FIG. 1 to FIG. 5, a semiconductor device according to some implementations may include a cell region 20, a cell region isolation film 22, and a peripheral area or region 24. The cell region isolation film 22 may be formed along an outer edge of the cell region 20. The cell region isolation film 22 may define the cell region 20 or a boundary of the cell region 20. The cell region isolation film 22 may separate the cell region 20 and the peripheral region 24 from each other. The peripheral region 24 may be formed along the periphery of the cell region 20. The peripheral region 24 may be defined as a periphery around the cell region 20.

The cell region 20 may include a plurality of cell active areas ACT. The cell active area ACT may be defined by a cell element separation film 105 formed in the substrate 100. As the design rule of the semiconductor device decreases, the cell active area ACT may have a bar shape extending in a diagonal line or an oblique line as shown in FIG. 2. For example, the cell active area ACT may extend in a third direction D3.

Each of a plurality of gate electrodes may extend in a first direction D1 and across the cell active area ACT. The plurality of gate electrodes may extend parallel to each other. Each of the plurality of gate electrodes may be embodied as, for example, each of a plurality of word-lines WL. The word-lines WL may be spaced from each other by an equal spacing. A width of the word-line WL or a spacing between word-lines WL may be determined according to the design rule.

The two word-lines WL extending in the first direction D1 may allow each cell active area ACT to be divided into three portions. The cell active area ACT may include a storage connection area and a bit-line connection area. The bit-line connection area may be located at a middle portion of the cell active area ACT, while the storage connection area may be located at an end of the cell active area ACT.

A plurality of bit-lines BL extending in a second direction D2 perpendicular to the extension direction of the word-line WL may be disposed on the word-lines WL. The plurality of bit-lines BL may extend parallel to each other. The bit-lines BL may be arranged to be spaced from each other by the same spacing. A width of the bit-line BL or a spacing between bit-lines BL may be determined according to the design rule.

A semiconductor device according to some implementations may include various contact arrangements formed on the cell active area ACT. The various contact arrangements may include, for example, a direct contact DC, a buried contact BC, and a landing pad LP, etc.

In this connection, the direct contact DC may mean a contact that electrically connects the cell active area ACT to the bit-line BL. The buried contact BC may mean a contact connecting the cell active area ACT to a lower electrode 191 of a capacitor. In terms of an arrangement structure, a contact area between the buried contact BC and the cell active area ACT may be small. Accordingly, a conductive landing pad LP may be introduced to expand the contact area between the cell active area ACT and the buried contact BC, and to expand the contact area between the buried contact BC and the lower electrode 191 of the capacitor.

The landing pad LP may be disposed between the cell active area ACT and the buried contact BC and may be disposed between the buried contact BC and the lower electrode 191 of the capacitor. In the semiconductor device according to some implementations, the landing pad LP may be disposed between the buried contact BC and the lower electrode 191 of the capacitor. Expanding the contact area via the introduction of the landing pad LP may allow a contact resistance between the cell active area ACT and the lower electrode 191 of the capacitor to be reduced.

The direct contact DC may be connected to the bit-line connection area. The buried contact BC may be connected to the storage connection area. As the buried contact BC is disposed in each of both opposing ends of the cell active area ACT, the landing pad LP may be disposed adjacent to each of both opposing ends of the cell active area ACT and partially overlap with the buried contact BC. In other words, the buried contact BC may be formed to overlap the cell active area ACT and the cell element separation film 105 between adjacent word-lines WL and between adjacent bit-lines BL.

The word-line WL may be formed as a structure buried in the substrate 100. The word-line WL may extend across the cell active area ACT between the direct contacts DC or between the buried contacts BC. As shown, two word-lines WL may extend through one cell active area ACT. As the cell active area ACT extends along the third direction D3, the extension direction of the word-line WL may have an angle smaller than 90 degrees with respective to the extension direction of the cell active area ACT.

The direct contacts DC and the buried contacts BC may be arranged in a symmetrical manner. Accordingly, the direct contacts DC and the buried contacts BC may be arranged in a straight line or substantially linearly along the first direction D1 and the second direction D2. Unlike the direct contact DC and the buried contact BC, the landing pads LP may be arranged in a zigzag manner in the second direction D2 which the bit-line BL extends. Further, the landing pads LP may overlap with the same portion of a side surface of each bit-line BL in the first direction D1 in which the word-line WL extends. For example, each of the landing pads LP in a first line may overlap with a left side surface of a corresponding bit-line BL, while each of the landing pads LP in a second line may overlap with a right side surface of the corresponding bit-line BL.

Referring to FIG. 3 to FIG. 5, the semiconductor device according to some implementations may include a plurality of cell gate structures 110, a plurality of bit-line structures 140ST, a plurality of storage contacts 120, an information storage 190 and a peripheral gate structure 240ST.

A substrate 100 may include the cell region 20, the cell region isolation film 22, and the peripheral region 24. The substrate 100 may be a silicon substrate or an SOI (siliconon-insulator). Alternatively, the substrate 100 may include silicon germanium, SGOI (silicon germanium on insulator), indium antimonide, lead tellurium compound, indium arsenic, indium phosphide, gallium arsenide or gallium antimonide. However, the present disclosure is not limited thereto.

The plurality of cell gate structures 110, the plurality of bit-line structures 140ST, the plurality of storage contacts 120, and the information storage 190 may be disposed in the cell region 20. The peripheral gate structure 240ST may be disposed in the peripheral region 24.

A cell element separation film 105 may be formed in the substrate 100 and in the cell region 20. The cell element separation film 105 may have an STI (shallow trench isolation) structure with excellent element separation ability. The cell element separation film 105 may define the cell active area ACT within the cell region 20. The cell active area ACT defined by the cell element separation film 105 may have an elongated island shape including a minor axis and a major axis as shown in FIG. 2. The cell active area ACT may have a diagonally extension shape to have an angle of smaller than 90 degrees with respect to the extension direction of the word-line WL horizontally flush with the cell element separation film 105. Further, the cell active area ACT may have a diagonally extension shape to have an angle of smaller than 90 degrees with respect to an extension direction of the bit-line BL formed on the cell element separation film 105.

The cell region isolation film 22 may have an STI structure. The cell region 20 may be defined by the cell region isolation film 22.

Each of the cell element separation film 105 and the cell region isolation film 22 may include, for example, at least one of a silicon oxide film, a silicon nitride film, and a silicon oxynitride film. However, the present disclosure is not limited thereto. In FIG. 4 and FIG. 5, each of the cell element separation film 105 and the cell region isolation film 22 is shown to be formed as a single insulating film. However, this is shown only for convenience of illustration, and the present disclosure is not limited thereto. Depending on a width of each of the cell element separation film 105 and the cell region isolation film 22, each of the cell element separation film 105 and the cell region isolation film 22 may be formed as a single insulating film, or as a stack of a plurality of insulating films.

In FIG. 4 and FIG. 5, a top face (e.g., an upper or top surface) of the cell element separation film 105, a top face of the substrate 100, and a top face of the cell region isolation film 22 are shown to be horizontally flush with each other. However, this is shown only for convenience of illustration, and the present disclosure is not limited thereto.

The cell gate structure 110 may be formed in the substrate 100 and the cell element separation film 105. The cell gate structure 110 may be formed along the cell element separation film 105 and the cell active area ACT defined by the cell element separation film 105. The cell gate structure 110 may include a cell gate trench 115 formed in the substrate 100 and the cell element separation film 105, a cell gate insulating film 111, a cell gate electrode 112, a cell gate capping pattern 113, and a cell gate capping conductive film 114. In this connection, the cell gate electrode 112 may act as the word-line WL. Unlike shown in FIGS. 4 and 5, the cell gate structure 110 may not include the cell gate capping conductive film 114.

The cell gate insulating film 111 may extend along a side wall and a bottom face (e.g., a lower or bottom surface) of the cell gate trench 115. The cell gate insulating film 111 may extend along a profile of at least a portion of the cell gate trench 115. The cell gate insulating film 111 may include, for example, at least one of silicon oxide, silicon nitride, silicon oxynitride, or high dielectric constant materials having a higher dielectric constant than that of silicon oxide. The high dielectric constant material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The cell gate electrode 112 may be formed on the cell gate insulating film 111. The cell gate electrode 112 may fill a portion of the cell gate trench 115. The cell gate capping conductive film 114 may extend along a top face of the cell gate electrode 112.

The cell gate electrode 112 may include at least one of metal, metal alloy, conductive metal carbonitride, conductive metal carbide, metal silicide, doped semiconductor material, conductive metal oxynitride, and conductive metal oxide. The cell gate electrode 112 may include at least one of for example, TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and combinations thereof. However, the present disclosure is not limited thereto. The cell gate capping conductive film 114 may include, for example, polysilicon or polysilicon germanium. However, the present disclosure is not limited thereto.

The cell gate capping pattern 113 may be disposed on the cell gate electrode 112 and the cell gate capping conductive film 114. The cell gate capping pattern 113 may fill a remaining portion of the cell gate trench 115 except for the cell gate electrode 112 and the cell gate capping conductive film 114. The cell gate insulating film 111 is shown to extend along a side wall of the cell gate capping pattern 113. However, the present disclosure is not limited thereto. The cell gate capping pattern 113 may include, for example, at least one of silicon nitride SiN, silicon oxynitride SiON, silicon oxide SiO₂, silicon carbonitride SiCN, silicon oxycarbonitride SiOCN, and combinations thereof.

Although not shown, an impurity doped area may be formed on at least one side of the cell gate structure 110. The impurity doped area may act as a source/drain area of the transistor.

The bit-line structure 140ST may include a cell conductive line 140 and a cell line capping film 144. The cell conductive line 140 may be formed on the substrate 100 including the cell gate structure 110, and on the cell element separation film 105 formed in the substrate 100. The cell conductive line 140 may intersect a cell element separation film 105, and the cell active area ACT defined by the cell element separation film 105. The cell conductive line 140 may be formed to intersect with the cell gate structure 110. In this connection, the cell conductive line 140 may act as the bit-line BL.

The cell conductive line 140 may be embodied as a multi-film. The cell conductive line 140 may include, for example, a first cell conductive film 141, a second cell conductive film 142, and a third cell conductive film 143. The first to third cell conductive films 141, 142, and 143 may be sequentially stacked on the substrate 100 and the cell element separation film 105. Although the cell conductive line 140 is shown to be composed of three films, the present disclosure is not limited thereto.

Each of the first to third cell conductive films 141, 142, and 143 may include, for example, at least one of a semiconductor material doped with impurities, a conductive silicide compound, a conductive metal nitride, a metal, and a metal alloy. For example, the first cell conductive film 141 may include a doped semiconductor material, the second cell conductive film 142 may include at least one of the conductive silicide compound and the conductive metal nitride, and the third cell conductive film 143 may include at least one of the metal and the metal alloy. However, the present disclosure is not limited thereto.

A bit-line contact 146 may be formed between the cell conductive line 140 and the substrate 100. That is, the cell conductive line 140 may be formed on the bit-line contact 146. For example, the bit-line contact 146 may be formed at a point where the cell conductive line 140 intersects a center portion of the cell active area ACT having an elongated island shape. The bit-line contact 146 may be formed between the bit-line connection area and the cell conductive line 140.

The bit-line contact 146 may electrically connect the cell conductive line 140 and the substrate 100 to each other. In this connection, the bit-line contact 146 may act as the direct contact DC. The bit-line contact 146 may include, for example, at least one of a semiconductor material doped with impurities, a conductive silicide compound, a conductive metal nitride, and a metal.

In an area in which the cell conductive line 140 overlaps a top face of the bit-line contact 146, the cell conductive line 140 may include the second cell conductive film 142 and the third cell conductive film 143. In an area in which the cell conductive line 140 does not overlap the top face of the bit-line contact 146, the cell conductive line 140 may include the first to third cell conductive films 141, 142, and 143.

In FIG. 4, it is shown that the bit-line contact 146 is not disposed between the cell conductive line 140 closest to the cell region isolation film 22 and the substrate 100. However, the present disclosure is not limited thereto. Alternatively, the bit-line contact 146 may be disposed between the cell conductive line 140 closest to the cell region isolation film 22 and the substrate 100.

The cell line capping film 144 may be disposed on the cell conductive line 140. The cell line capping film 144 may extend in the second direction D2 and along a top face of the cell conductive line 140. In this connection, the cell line capping film 144 may include, for example, at least one of silicon nitride, silicon oxynitride, silicon carbonitride, and silicon oxycarbonitride. In a semiconductor memory device according to some implementations, the cell line capping film 144 may include, for example, a silicon nitride film. The cell line capping film 144 is shown to be a single film, but is not limited thereto. The cell line capping film 144 may be a multi-film. However, when films constituting the multi-film are made of the same material, the cell line capping film 144 may act as a single film.

A cell insulating film 130 may be formed on the substrate 100 and the cell element separation film 105. More specifically, the cell insulating film 130 may be formed on a portion of the top face of the substrate 100 and the cell element separation film 105 on which the bit-line contact 146 is not formed. The cell insulating film 130 may be formed between the substrate 100 and the cell conductive line 140, and between the cell element separation film 105 and the cell conductive line 140.

The cell insulating film 130 may be a single film. However, as illustrated, the cell insulating film 130 may be embodied as a multi-film including a first cell insulating film 131 and a second cell insulating film 132. For example, the first cell insulating film 131 may include a silicon oxide film, while the second cell insulating film 132 may include a silicon nitride film. However, the present disclosure is not limited thereto. In another example, the cell insulating film 130 may be embodied as a triple film including a silicon oxide film, a silicon nitride film, and a silicon oxide film. However, the present disclosure is not limited thereto.

Unlike shown, a cell buffer film including, for example, a silicon oxide film may be further disposed between the cell insulating film 130 and the cell region isolation film 22.

The bit-line structure 140ST may extend in an elongated manner in the second direction D2. The bit-line structure 140ST may include a distal end disposed on the cell region isolation film 22. A cell spacer portion 281 to be described later may be disposed on a side surface of a distal end of the bit-line structure 140ST. The cell spacer portion 281 may be disposed on a vertical side surface of a distal end of the bit-line structure 140ST.

In a semiconductor device according to some implementations, a side surface of the cell insulating film 130 may be substantially vertically flush with a side surface of the bit-line structure 140ST.

The bit-line structure 140ST may include a first portion having a first vertical dimension h1 and a second portion having a second vertical dimension h2 from a top face of the cell insulating film 130. The second portion may include a distal end of the bit-line structure 140ST. For example, the second vertical dimension h2 may be smaller than the first vertical dimension h1. A top face 140ST_2_US of the second portion may be lower than a top face 140ST_1_US of the first portion. Accordingly, a top face of the bit-line structure 140ST may have a step. In an area in which the bit-line structure 140ST overlaps the cell region isolation film 22, the top face of the bit-line structure 140ST may have a step. Alternatively, unlike illustrated, in an area in which the bit-line structure 140ST does not overlap with the cell region isolation film 22, the top face of the bit-line structure 140ST may have a step.

Further, the bit-line structure 140ST may further include a third portion having a third vertical dimension (e.g., h3; not shown) from the top face of the cell insulating film 130. The first portion may be disposed between the second portion and the third portion. The third portion may overlap with a pad separation insulating film 180 to be described later. For example, the third vertical dimension may be smaller than the first vertical dimension h1. However, the present disclosure is not limited thereto. Further, the third vertical dimension may be different from the second vertical dimension h2. Alternatively, the third vertical dimension may be substantially the same as the second vertical dimension h2, unlike shown in the drawings.

A fence pattern 170 may be disposed on the substrate 100 and the cell element separation film 105. The fence pattern 170 may be formed to overlap the cell gate structure 110 formed in the substrate 100 and the cell element separation film 105. The fence pattern 170 may be disposed between the bit-line structures 140ST extending in the second direction D2. The fence pattern 170 may include, for example, at least one of silicon oxide, silicon nitride, silicon oxynitride, and combinations thereof.

The storage contact 120 may be disposed between the cell conductive lines 140 adjacent to each other in the first direction D1. The storage contact 120 may be disposed between fence patterns 170 adjacent to each other in the second direction D2. The storage contact 120 may overlap a portion of the substrate 100 and a portion of the cell element separation film 105 between adjacent cell conductive lines 140. The storage contact 120 may be connected to the storage connection area of the cell active area ACT. In this connection, the storage contact 120 may act as the buried contact BC.

The storage contact 120 may include, for example, at least one of a semiconductor material doped with impurities, a conductive silicide compound, a conductive metal nitride, and a metal.

The storage pad 160 may be formed on the storage contact 120. The storage pad 160 may be electrically connected to the storage contact 120. In this connection, the storage pad 160 may act as the landing pad LP.

The storage pad 160 may overlap with a portion of a top face of the bit-line structure 140ST. The storage pad 160 may include, for example, at least one of a semiconductor material doped with impurities, a conductive silicide compound, a conductive metal nitride, a conductive metal carbide, a metal, and a metal alloy.

The pad separation insulating film 180 may be formed on the storage pad 160 and the bit-line structure 140ST. For example, the pad separation insulating film 180 may be disposed on the cell line capping film 144. The pad separation insulating film 180 may define an area of the storage pad 160 forming a plurality of isolated areas. Further, the pad separation insulating film 180 may not cover a top face of the storage pad 160.

The pad separation insulating film 180 may include an insulating material and may electrically separate a plurality of storage pads 160 from each other. For example, the pad separation insulating film 180 may include at least one of a silicon oxide film, a silicon nitride film, a silicon oxynitride film, a silicon oxycarbonitride film, and a silicon carbonitride film.

The peripheral gate structure 240ST may be disposed on the substrate 100 and in the peripheral region 24. The peripheral gate structure 240ST may be disposed on a peripheral active area defined by a peripheral element separation film. Further, a portion of the peripheral gate structure 240ST is shown to overlap with the cell region isolation film 22. However, the present disclosure is not limited thereto.

The peripheral gate structure 240ST may include a peripheral gate insulating film 230, a peripheral gate conductive film 240, and a peripheral capping film 244 sequentially stacked on the substrate 100. A peripheral spacer 245 may be disposed on a side wall or side surface of the peripheral gate structure 240ST.

The peripheral gate conductive film 240 may include first to third peripheral conductive films 241, 242, and 243 sequentially stacked on the peripheral gate insulating film 230. In one example, no additional conductive film may be disposed between the peripheral gate conductive film 240 and the peripheral gate insulating film 230. In another example, unlike shown, an additional conductive film such as a work function conductive film may be disposed between the peripheral gate conductive film 240 and the peripheral gate insulating film 230.

The first to third peripheral conductive films 241, 242, and 243 may respectively include the same materials as those of the first to third cell conductive films 141, 142, and 143. The peripheral gate insulating film 230 may include, for example, silicon oxide, silicon nitride, silicon oxynitride, or a high dielectric constant material having a higher dielectric constant than that of the silicon oxide. The peripheral capping film 244 may include, for example, at least one of silicon nitride, a silicon oxynitride, and a silicon oxide.

The peripheral spacer 245 may include, for example, at least one of silicon nitride, silicon oxynitride, silicon oxide, silicon carbonitride, silicon oxycarbonitride, and combinations thereof. The peripheral spacer 245 is shown to be embodied as a single film; however, this is shown only for convenience of illustration, and the present disclosure is not limited thereto. In another example, the peripheral spacer 245 may be embodied as a multi-film. In a semiconductor device according to some implementations, the peripheral spacer 245 disposed on the side surface of the peripheral gate structure 240ST may include a different material than that of the cell spacer portion 281 disposed on the side surface of the bit-line structure 140ST. For example, the peripheral spacer 245 may include silicon oxide, while the cell spacer portion 281 may include silicon nitride.

A first etching stopper film 251 may extend along the top face 140ST_1_US of the first portion of the bit-line structure 140ST. The first etching stopper film 251 may not extend along the top face 140ST_2_US of the second portion of the bit-line structure 140ST. The first etching stopper film 251 may extend along a side surface of the bit-line structure 140ST and a side surface of the cell insulating film 130. The first etching stopper film 251 may extend along a vertical side surface of a distal end of the bit-line structure 140ST and a vertical side surface of the distal end of the cell insulating film 130. The first etching stopper film 251 may extend along a side surface of the peripheral gate insulating film 230, a side surface of the peripheral gate conductive film 240, and a side surface and a top face of the peripheral capping film 244.

A second etching stopper film 252 may extend along the first etching stopper film 251 disposed on the top face 140ST_1_US of the first portion of the bit-line structure 140ST. The second etching stopper film 252 may not extend along the top face 140ST_2_US of the second portion of the bit-line structure 140ST. The second etching stopper film 252 may extend along a side surface 281_S of the cell spacer portion 281, and a top face 22_US of the cell area defining film (e.g., the cell region isolation film 222) to be described later. The second etching stopper film 252 may extend along a profile of the peripheral spacer 245 and the peripheral gate structure 240ST.

Each of the first etching stopper film 251 and the second etching stopper film 252 may include at least one of, for example, silicon nitride, silicon oxynitride, silicon carbonitride, and silicon oxycarbonitride.

An inserted insulating film 290 may be disposed on the second etching stopper film 252 and between the bit-line structure 140ST and the peripheral gate structure 240ST. The inserted insulating film 290 may fill at least a portion of a space disposed on the cell region isolation film 22 and defined by the second etching stopper film 252. The inserted insulating film 290 may fill a space disposed between the bit-line structure 140ST and the peripheral gate structure 240ST and defined by the second etching stopper film 252 and an interlayer insulating film 280 to be described later.

The inserted insulating film 290 may include a material different from that of the interlayer insulating film 280. The inserted insulating film 290 may include, for example, an oxide-based insulating material.

The interlayer insulating film 280 may cover the second etching stopper film 252, the bit-line structure 140ST, the inserted insulating film 290, and the peripheral gate structure 240ST. Further, the interlayer insulating film 280 may fill a space between the first etching stopper film 251 disposed on the distal end of the bit-line structure 140ST and the second etching stopper film 252.

The interlayer insulating film 280 may include the cell spacer portion 281 and an interlayer insulating film portion 282.

The cell spacer portion 281 may be disposed on the cell region isolation film 22. The cell spacer portion 281 may be disposed on a vertical side surface of the distal end of the bit-line structure 140ST. The cell spacer portion 281 may fill a space defined by the first etching stopper film 251 disposed on the vertical side surface of the distal end of the bit-line structure 140ST and the second etching stopper film 252.

The interlayer insulating film portion 282 may cover the second etching stopper film 252, the bit-line structure 140ST, the inserted insulating film 290, and the peripheral gate structure 240ST. The interlayer insulating film portion 282 may be disposed on the second etching stopper film 252 and between the bit-line structure 140ST and the peripheral gate structure 240ST.

The interlayer insulating film portion 282 may fill at least a portion of a space defined by the second etching stopper film 252 and be disposed on the cell region isolation film 22. The interlayer insulating film portion 282 may directly contact a side wall of the second etching stopper film 252. The interlayer insulating film portion 282 may be disposed on the second etching stopper film 252 on the side surface 281_S of the cell spacer portion 281. The interlayer insulating film portion 282 may be disposed on the second etching stopper film 252 adjacent to the cell spacer portion 281. That is, the inserted insulating film 290 and the interlayer insulating film portion 282 may be sequentially stacked on the second etching stopper film 252 and between the bit-line structure 140ST and the peripheral gate structure 240ST. The cell spacer portion 281 may be disposed between the first etching stopper film 251 and the second etching stopper film 252. The interlayer insulating film portion 282 may be separated from the cell spacer portion 281 via the second etching stopper film 252. The interlayer insulating film portion 282 may be disposed between the cell spacer portion 281 and the peripheral spacer 245.

The interlayer insulating film portion 282 may directly contact the inserted insulating film 290. A side surface 282_S of the interlayer insulating film portion 282 in contact with the inserted insulating film 290 may be curved along an interface between the interlayer insulating film portion 282 and the inserted insulating film 290. The side surface 282_S of the interlayer insulating film portion 282 in contact with the inserted insulating film 290 may be convex toward the inserted insulating film 290, that is, the side surface 282_S of the interlayer insulating film portion 282 may have a convex shape that protrudes toward the inserted insulating film 290.

As shown, the side surface 282_S of the interlayer insulating film portion 282 may meet a bottom corner of the second etching stopper film 252 adjacent to the cell spacer portion 281. Alternatively, unlike illustrated, the side surface 282_S of the interlayer insulating film portion 282 may be formed along at least a portion of a bottom face of the second etching stopper film 252 adjacent to the cell spacer portion 281.

The interlayer insulating film 280 may include, for example, a nitride-based insulating material. The cell spacer portion 281 and the interlayer insulating film portion 282 may include the same material. For example, each of the cell spacer portion 281 and the interlayer insulating film portion 282 may include silicon nitride.

Referring to FIGS. 1 and 3, the interlayer insulating film portion 282 and the inserted insulating film 290 may be disposed on the distal end of the bit-line BL. The interlayer insulating film portion 282 and the inserted insulating film 290 may extend in the same direction as the extension direction of the bit-line BL. For example, the interlayer insulating film portion 282 and the inserted insulating film 290 may extend along the second direction D2. The buried contacts BC may be arranged in a straight line or substantially linearly along the first direction D1 and the second direction D2. The landing pads LP may be arranged in a zigzag manner in the second direction D2. The buried contact BC may be formed between adjacent interlayer insulating film portions 282 and between adjacent inserted insulating films 290. The landing pads LP may be arranged in a zigzag manner in a second direction D2 in which each of the interlayer insulating film portion 282 and the inserted insulating film 290 extends.

When the interlayer insulating film 280 includes silicon oxide, the interlayer insulating film 280 may be less resistant to a dry etching process, and thus may be etched away together with contact formation. For example, when the interlayer insulating film 280 includes silicon oxide, at least a portion of the interlayer insulating film 280 may be etched together with formation of the buried contact BC shown in FIG. 3. Accordingly, contacts spaced apart from each other may be electrically connected to each other, such that reliability of the semiconductor device may be degraded.

However, in a semiconductor device according to some implementations, the interlayer insulating film 280 including silicon nitride may be disposed on the second etching stopper film 252 disposed on the distal end of the bit-line structure 140ST. Therefore, the interlayer insulating film 280 is resistant to the dry etching process, such that the interlayer insulating film 280 may not be etched during the formation of the buried contact BC shown in FIG. 3. Accordingly, the reliability of the semiconductor device may be improved.

In FIGS. 4 and 5, a peripheral wire line 265 may be disposed on the interlayer insulating film portion 282. The peripheral wire line 265 may pass through the cell line capping film 144 and may be connected to the cell conductive line 140. Further, although not shown, the peripheral wire line 265 may be connected to the cell gate electrode 112. A peripheral wire separation pattern 270 may divide the peripheral wire line 265 into two portions.

The peripheral wire line 265 may include the same material as that of the storage pad 160. The peripheral wire separation pattern 270 may include, for example, at least one of a silicon oxide film, a silicon nitride film, a silicon oxynitride film, a silicon oxycarbonitride film, and a silicon carbonitride film.

A third etching stopper film 292 may be disposed on the pad separation insulating film 180 and the storage pad 160. The third etching stopper film 292 may extend to the peripheral region 24 as well as the cell region 20. The third etching stopper film 292 may be disposed on the peripheral wire line 265 and the peripheral wire separation pattern 270. The third etching stopper film 292 may include at least one of a silicon nitride film, a silicon carbonitride film, a silicon boron nitride film (SiBN), a silicon oxynitride film, and a silicon oxycarbide film.

The information storage 190 may be disposed on the storage pad 160. The information storage 190 may be electrically connected to the storage pad 160. A portion of the information storage 190 may be disposed in the third etching stopper film 292. The information storage 190 may include, for example, a capacitor. However, the present disclosure is not limited thereto. The information storage 190 includes a lower electrode 191, a capacitor dielectric film 192, and an upper electrode 193.

The lower electrode 191 may be disposed on the storage pad 160. The lower electrode 191 is shown to have a pillar shape. However, the present disclosure is not limited thereto. In another example, the lower electrode 191 may have a cylindrical shape. The capacitor dielectric film 192 is formed on the lower electrode 191. The capacitor dielectric film 192 may be formed along a profile of the lower electrode 191. The upper electrode 193 is formed on the capacitor dielectric film 192. The upper electrode 193 may cover an outer wall of the lower electrode 191.

In one example, the capacitor dielectric film 192 may only have a portion vertically overlapping the upper electrode 193. In another example, as illustrated, the capacitor dielectric film 192 may include a first portion vertically overlapping with the upper electrode 193 and a second portion not vertically overlapping with the upper electrode 193.

Each of the lower electrode 191 and the upper electrode 193 may include, for example, a doped semiconductor material, a conductive metal nitride such as titanium nitride, tantalum nitride, niobium nitride or tungsten nitride, etc., a metal such as ruthenium, iridium, titanium or tantalum, etc. or a conductive metal oxide such as iridium oxide or niobium oxide, etc. However, the present disclosure is not limited thereto.

The capacitor dielectric film 192 may include, for example, one of silicon oxide, silicon nitride, silicon oxynitride, and high dielectric constant material, and combinations thereof. However, the present disclosure is not limited thereto. In a semiconductor device according to some implementations, the capacitor dielectric film 192 may include a stack structure in which a zirconium oxide film, an aluminum oxide film, and a zirconium oxide film are sequentially stacked. In a semiconductor device according to some implementations, the capacitor dielectric film 192 may include a dielectric film including hafnium (Hf). In a semiconductor device according to some implementations, the capacitor dielectric film 192 may have a stack structure of a ferroelectric material film and a paraelectric material film.

A peripheral interlayer insulating film 293 may be disposed on the third etching stopper film 292. The peripheral interlayer insulating film 293 may cover a side wall of the upper electrode 193. The peripheral interlayer insulating film 293 may include, for example, an insulating material.

Figure 6:
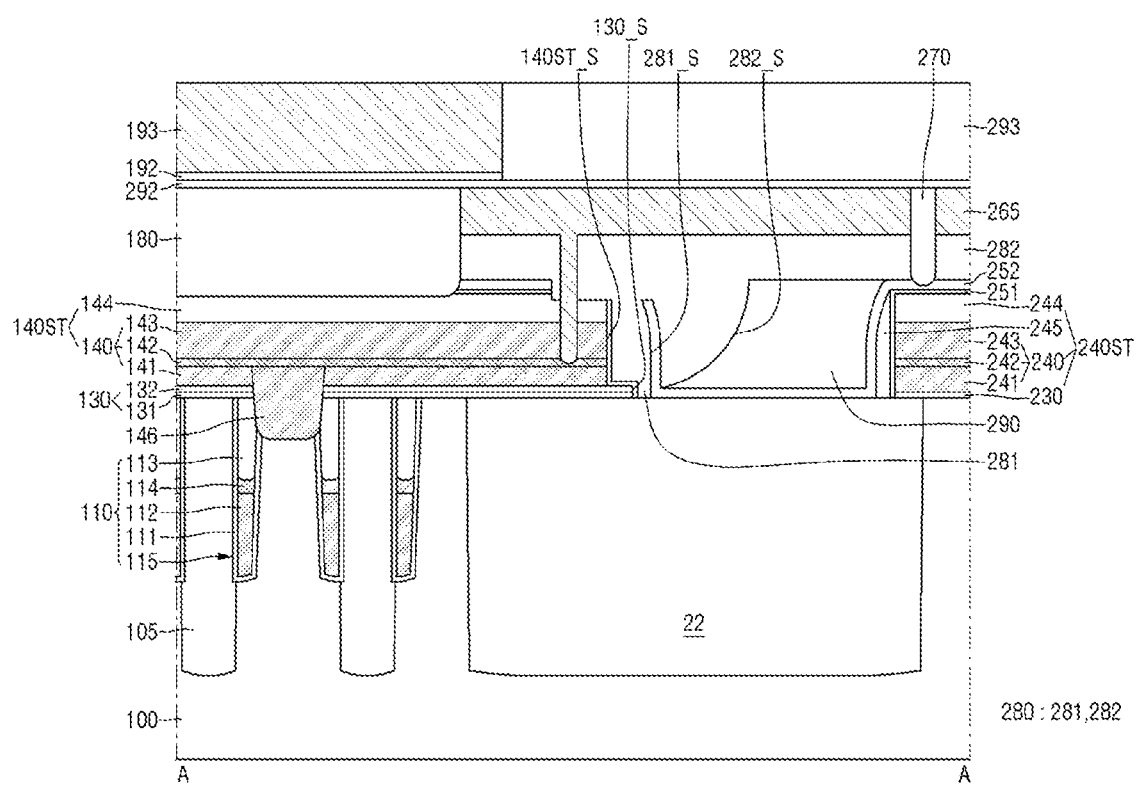
FIGS. 6, 7, and FIG. 8 are diagrams for illustration of a semiconductor device according to some implementations.
Figure 7:
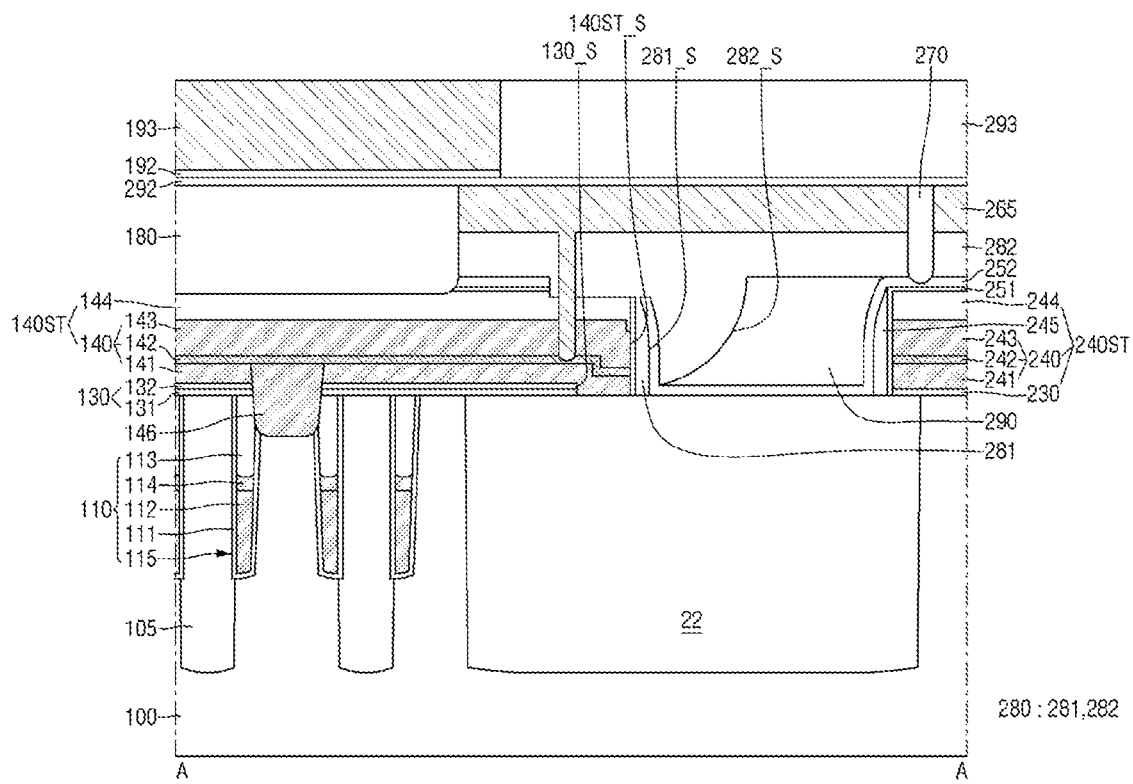
Figure 8:
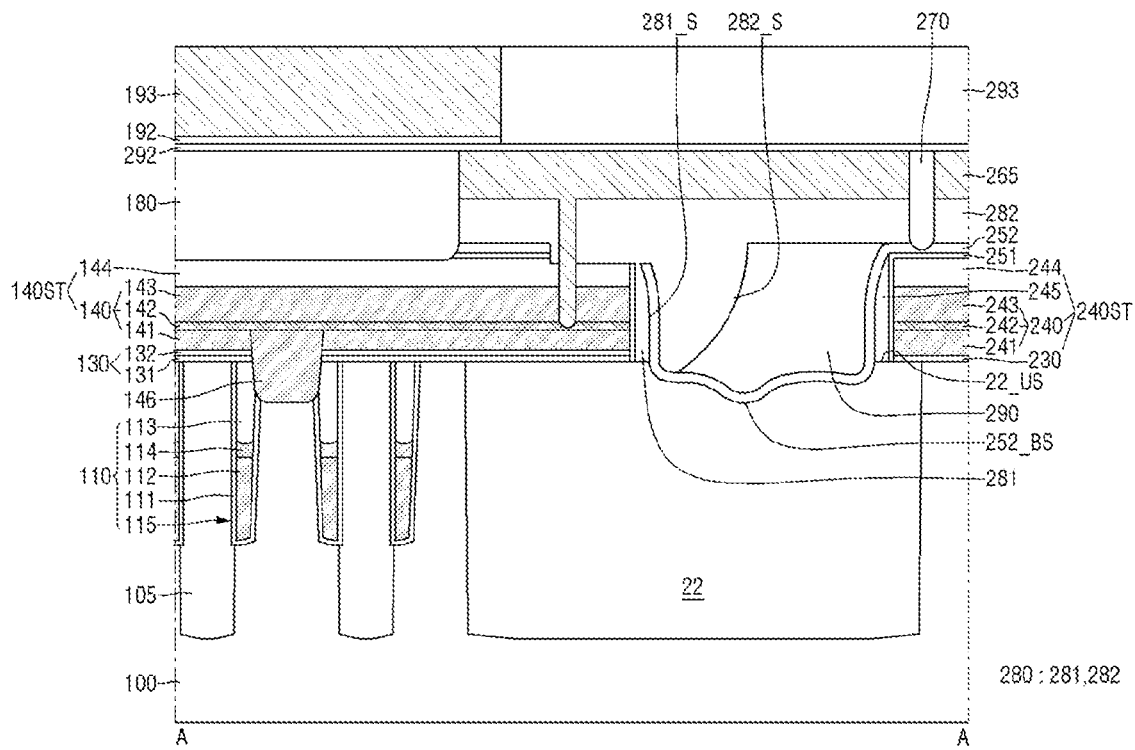

FIG. 6 to FIG. 8 are diagrams for illustration of a semiconductor device according to some implementations. For the convenience of illustration, following descriptions are based on differences from those described using FIG. 1 to FIG. 5.

For reference, FIG. 6 to FIG. 8 are cross-sectional views taken along a line A-A in FIG. 1.

Referring to FIG. 6, in a semiconductor device according to some implementations, a distal end of the cell insulating film 130 may protrude from the distal end of the bit-line structure 140ST. A side surface 130_S of the cell insulating film 130 may protrude beyond a side surface 140ST_S of the bit-line structure 140ST and toward the peripheral gate structure 240ST.

The first etching stopper film 251 may extend along a top face of the cell insulating film 130 protruding from the distal end of the bit-line structure 140ST and the side surface 130S of the cell insulating film 130. The cell spacer portion 281 may cover the cell insulating film 130 protruding from the distal end of the bit-line structure 140ST.

Referring to FIG. 7, in a semiconductor device according to some implementations, the distal end of the bit-line structure may protrude from the distal end of the cell insulating film 130. The side surface 140ST_S of the bit-line structure may protrude from the side surface 130_S of the cell insulating film 130.

The first etching stopper film 251 may extend along the side surface 140ST_S of the bit-line structure 140ST.

Referring to FIG. 8, in a semiconductor device according to some implementations, at least a portion of the second etching stopper film 252 may be recessed into the cell region isolation film 22. A bottom face or lower surface 252_BS of the second etching stopper film 252 may be disposed below a top face or upper surface 22_US of the cell area defining film or cell region isolation film 22.

The bottom face 252_BS of the second etching stopper film 252 may include at least one of a convex portion convex toward the cell region isolation film 22 and a concave portion concave toward the cell region isolation film 22.

As shown, the interlayer insulating film portion 282 may be formed along at least a portion of the bottom face 252_BS of the second etching stopper film 252 adjacent to the cell spacer portion 281. Alternatively, unlike shown, the interlayer insulating film portion 282 may meet the cell spacer portion 281 at a corner of the bottom face 252_BS of the second etching stopper film 252 adjacent thereto.

FIG. 9 to FIG. 13 are diagrams of intermediate structures to illustrate a semiconductor device manufacturing method according to some implementations. Descriptions duplicate with those described using FIG. 1 to FIG. 8 among the descriptions about the manufacturing method are briefly described or omitted.

Figure 9:
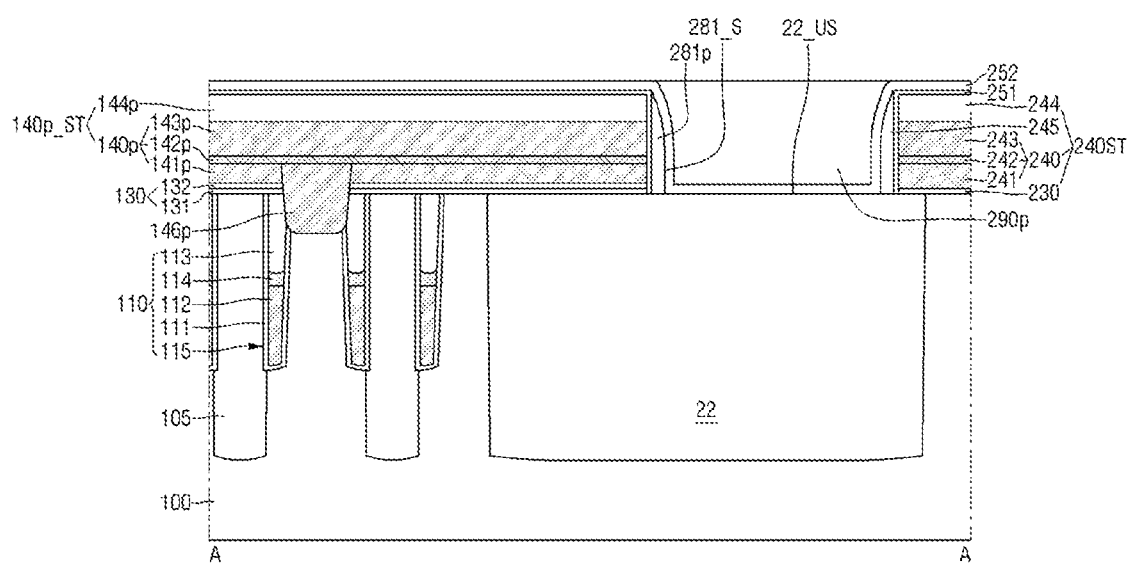
FIGS. 9, 10, 11, 12, and FIG. 13 are diagrams of intermediate structures to illustrate a semiconductor device manufacturing method according to some implementations.

Referring to FIG. 9, the substrate 100 including the cell region 20, the peripheral region 24 and the cell region isolation film 22 may be provided.

Subsequently, the cell insulating film 130 may be formed on the cell region 20. The cell insulating film 130 may expose the peripheral region 24 of the substrate 100.

Subsequently, a cell conductive film structure 140p_ST may be formed on the substrate 100 and in the cell region 20. The cell conductive film structure 140p_ST may be formed on the cell insulating film 130. The cell conductive film structure 140p_ST may include a pre-cell conductive film 140p and a pre-cell capping film 144p sequentially stacked on the cell insulating film 130. Further, between the cell conductive film structure 140p_ST and the substrate 100, a pre-bit-line contact 146p may be formed. The pre-bit-line contact 146p may connect the cell conductive film structure 140p_ST and the substrate 100 to each other.

The peripheral gate insulating film 230, the peripheral gate conductive film 240, and the peripheral capping film 244 may be formed on the substrate 100 and in the peripheral region 24. The peripheral gate insulating film 230, the peripheral gate conductive film 240, and the peripheral capping film 244 may be formed simultaneously with the formation of the cell conductive film structure 140p_ST.

Subsequently, the first etching stopper film 251 may be formed along the top face of the cell conductive film structure 140p_ST, the side surface of the cell conductive film structure 140p_ST, the side surface of each of the peripheral gate insulating film 230, the peripheral gate conductive film 240, and the peripheral capping film 244, and the top face of the peripheral capping film 244. The first etching stopper film 251 may expose at least a portion of the top face 22_US of the cell area defining film or cell region isolation film 22.

Subsequently, a sacrificial spacer 281p may be formed on the side surface of the cell conductive film structure 140p_ST. The peripheral spacer 245 may be formed on the side surface of the peripheral gate structure 240ST.

Subsequently, the second etching stopper film 252 may be formed along the side wall of the first etching stopper film 251, a side wall or side surface 281_S of the sacrificial spacer 281p, the top face 22_US of the cell area defining film 22, and a side wall of the peripheral spacer 245. Each of the pre-cell capping film 144p, the first etching stopper film 251, and the second etching stopper film 252 may include, for example, silicon nitride. The sacrificial spacer 281p may include, for example, silicon oxide.

Subsequently, a pre-inserted insulating film 290p may be formed on the second etching stopper film 252. The pre-inserted insulating film 290p may fill a space between the cell conductive film structure 140p_ST and the peripheral gate structure 240ST and be disposed on the second etching stopper film 252. The pre-inserted insulating film 290p may include, for example, silicon oxide.

Figure 10:
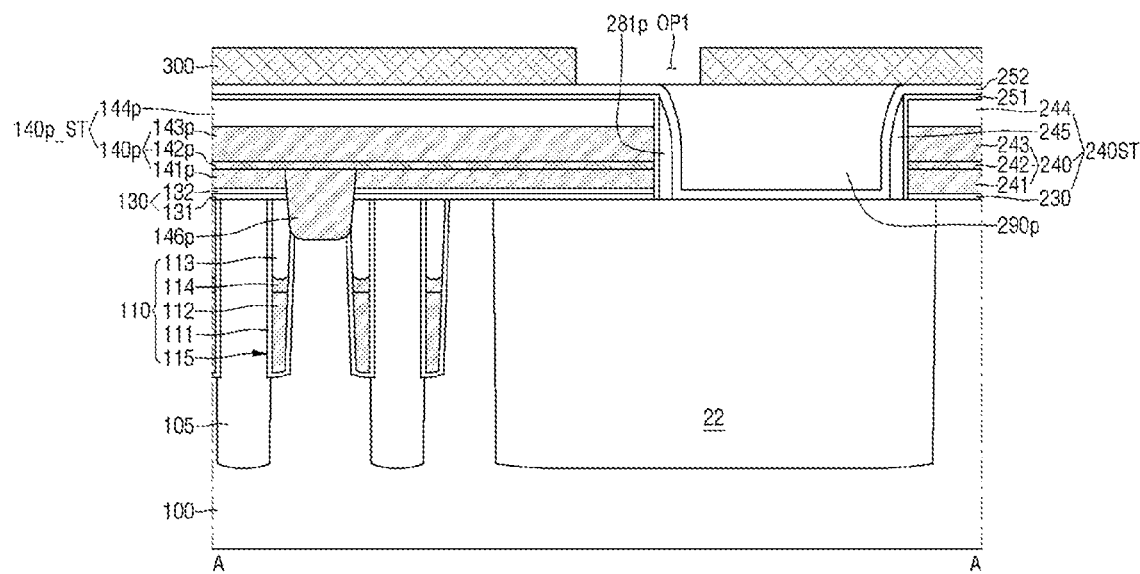

Referring to FIG. 10, a mask pattern 300 including a first opening OP1 may be formed on the second etching stopper film 252. The first opening OP1 may expose a portion of a top face of the second etching stopper film 252 on the cell conductive film structure 140p_ST and the sacrificial spacer 281p, and expose a portion of a top face of the pre-inserted insulating film 290p.

Figure 11:
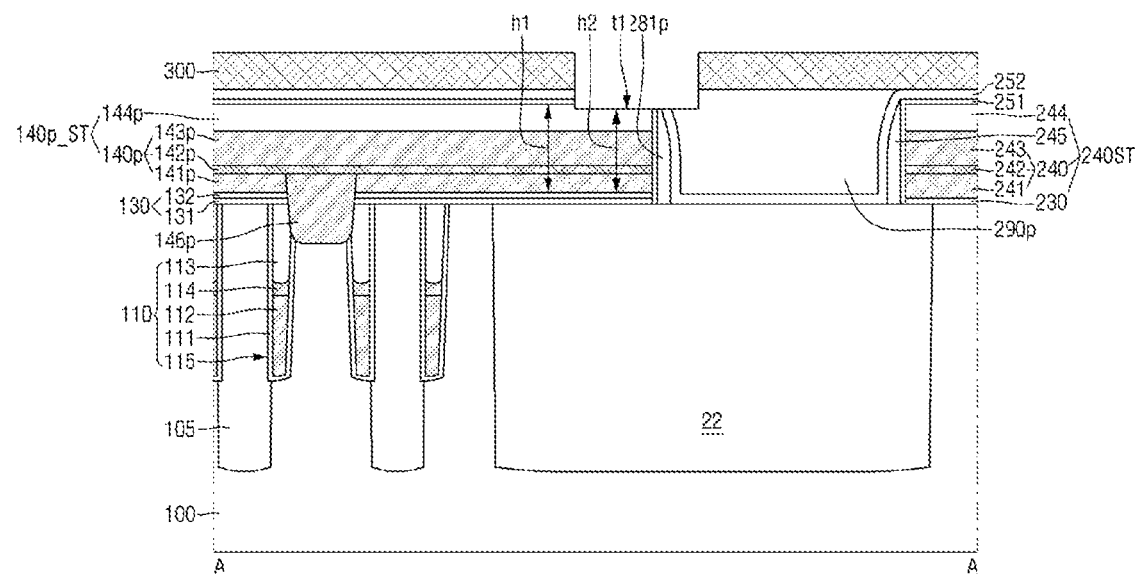

Referring to FIG. 11, an etching process may be performed using the mask pattern 300 as an etching mask so that a top face of the sacrificial spacer 281p is exposed. For example, a dry etching process may be performed. Accordingly, a first trench t1 may be formed. The first trench t1 may at least partially expose the pre-cell capping film 144p, the first etching stopper film 251 on the side surface of the cell conductive film structure 140p_ST, the top face of the sacrificial spacer 281p, the second etching stopper film 252 on the side surface of the sacrificial spacer 281p, and the pre-inserted insulating film 290p. Further, a step may be formed on the top face of the cell conductive film structure 140p_ST due to the first trench t1. That is, a first portion having a first vertical dimension h1 from a top face of the cell insulating film 130 and a second portion having a second vertical dimension h2 from the top face of the cell insulating film 130 may be formed.

Figure 12:
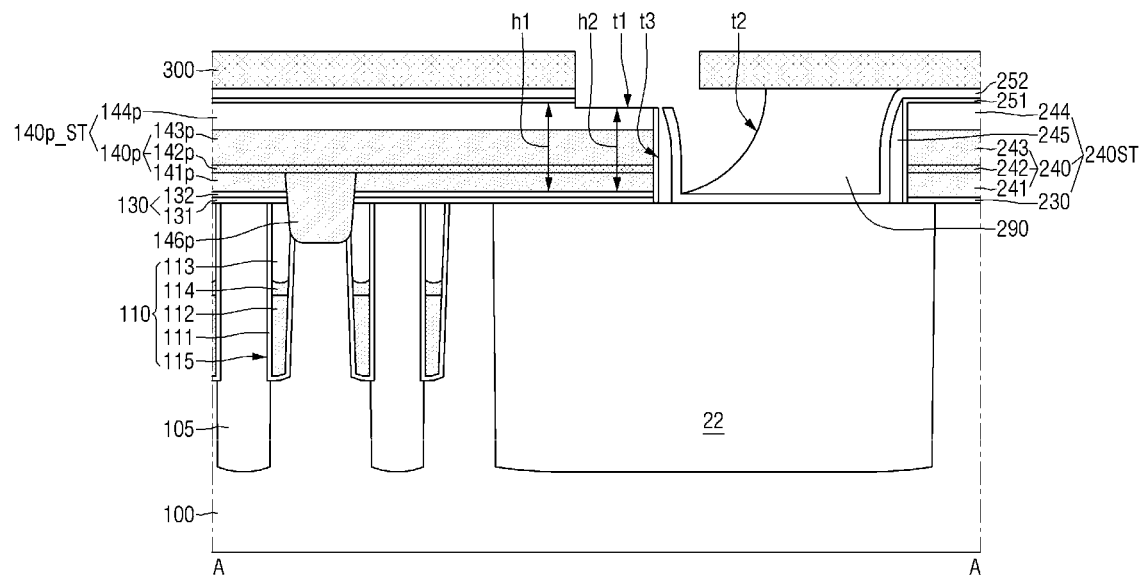

Referring to FIGS. 11 and 12, an etching process may be performed using a mask pattern 300 as an etching mask. For example, a wet etching process may be performed. For example, a wet etching process may be performed using a hydrofluoric acid (HF) aqueous solution. Accordingly, a portion of the pre-inserted insulating film 290p is removed to form a second trench t2 and the inserted insulating film 290 may be formed. Further, the sacrificial spacer 281p may be removed to form a third trench t3.

The second trench t2 may expose a portion of the inserted insulating film 290. The second trench t2 may be recessed toward the inserted insulating film 290. A bottom face of the second trench t2 may be convex toward the inserted insulating film 290. This may be due to the wet etching process.

The third trench t3 may expose at least a portion of a top face of the cell region isolation film 22 between the first etching stopper film 251 disposed on the distal end of the cell conductive film structure 140p_ST and the second etching stopper film 252.

Figure 13:
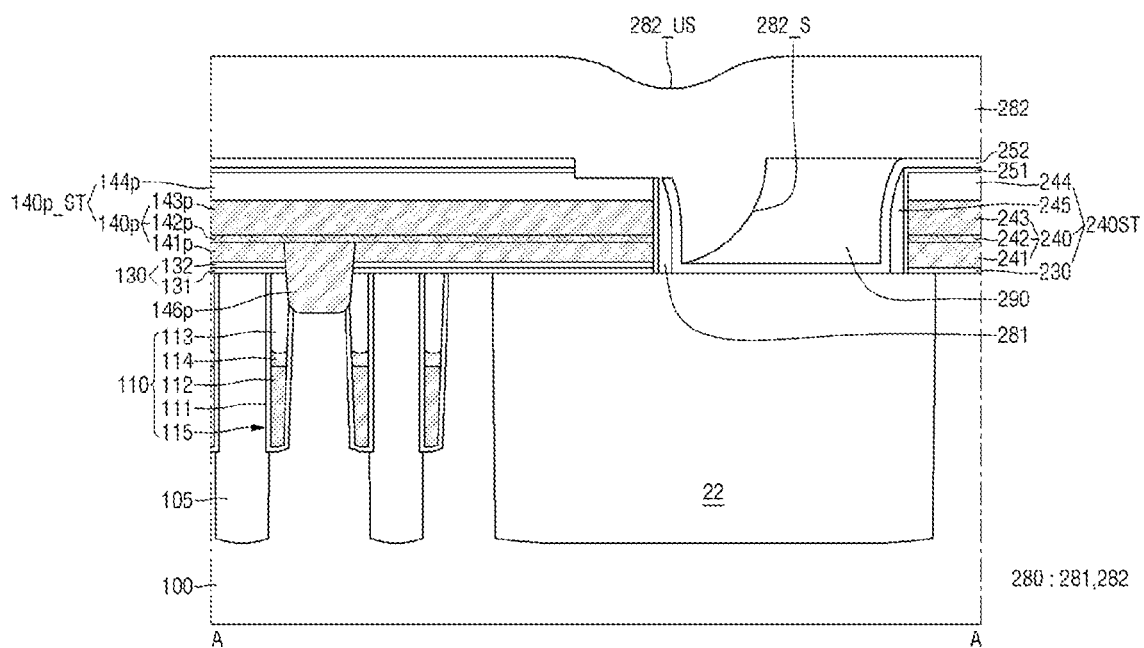

Referring to FIG. 12 and FIG. 13, the mask pattern 300 may be removed. The interlayer insulating film 280 may be formed. The interlayer insulating film 280 may cover the second etching stopper film 252 and the first to third trenches t1, t2, and t3. The interlayer insulating film 280 may fill the first to third trenches t1, t2 and t3. Accordingly, the cell spacer portion 281 filling the third trench t3 and the interlayer insulating film portion 282 filling the first and second trenches t1 and t2 and covering the second etching stopper film 252 and the cell conductive film structure 140p_ST may be formed.

The top face 282_US of the interlayer insulating film portion may be convex toward the substrate 100. This may be due to the first to third trenches t1, t2, and t3. Alternatively, unlike shown, the top face 282_US of the interlayer insulating film portion may be planarized using a planarization process.

Subsequently, referring to FIG. 13, FIG. 14, and FIG. 15, the cell conductive film structure 140p_ST, the interlayer insulating film 280 and the second etching stopper film 252 in the cell region 20 may be patterned, such that the bit-line structure 140ST extending in the second direction D2 may be formed. While the bit-line structure 140ST is formed, the bit-line contact 146 may be formed.

Subsequently, the fence pattern 170 and the storage contact 120 may be formed on the cell gate structure 110. Subsequently, the storage pad 160, the peripheral wire line 265, and the peripheral wire separation pattern 270 may be formed. Subsequently, the third etching stopper film 292 may be formed. Further, the information storage 190 may be formed.

Figure 14:
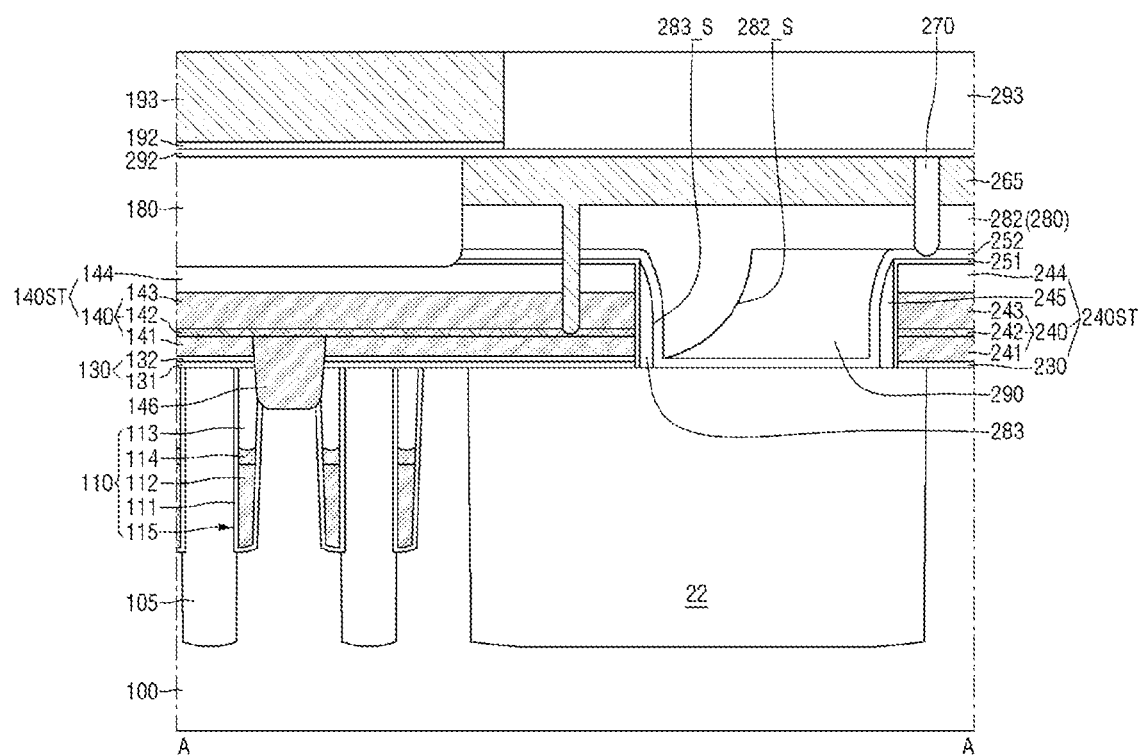
FIG. 14 is a diagram for illustration of a semiconductor device according to some implementations.

FIG. 14 is a diagram for illustration of a semiconductor device according to some implementations. For the convenience of illustration, following descriptions are based on differences from those described using FIG. 1 to FIG. 5.

Referring to FIG. 14, in a semiconductor device according to some implementations, the cell spacer 283 may be formed at a location corresponding to the cell spacer portion 281 of FIGS. 1 to 5. The cell spacer 283 may be separated from the interlayer insulating film 280. The cell spacer 283 may be spaced from the interlayer insulating film 280 via the second etching stopper film 252. The second etching stopper film 252 may be continuously formed along the top face of the bit-line structure 140ST and the side surface 283_S of the cell spacer 283. The side surface 283_S of the cell spacer 283 may directly and entirely contact the second etching stopper film 252.

The cell spacer 283 may include a material different from that of the interlayer insulating film 280. For example, the cell spacer 283 may include an oxide-based insulating material.

The interlayer insulating film 280 may include the interlayer insulating film portion 282. A portion of the top face of the bit-line structure 140ST overlapping the interlayer insulating film 280 may be free of a step.

Figure 15:
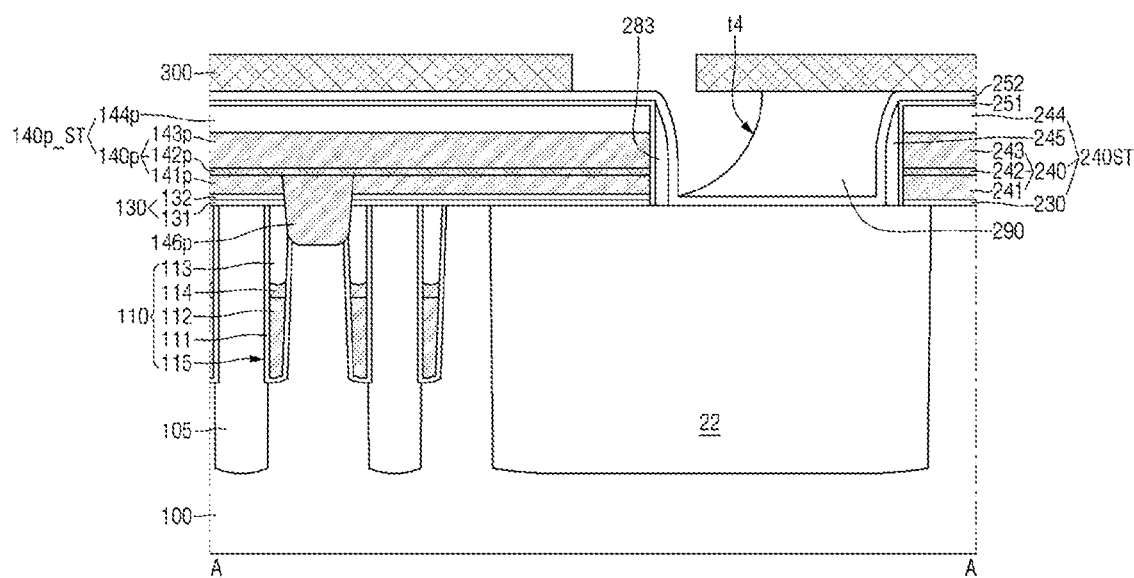
FIG. 15 is a diagram of an intermediate structure to illustrate a semiconductor device manufacturing method according to some implementations.

FIG. 15 is a diagram of an intermediate structure to illustrate a semiconductor device manufacturing method according to some implementations. Descriptions duplicate with those described using FIG. 9 to FIG. 13 are briefly described or omitted.

For reference, FIG. 15 may be a drawing subsequent to a process of FIG. 10. The cell spacer 283 in FIG. 15 may correspond to the sacrificial spacer 281p in FIG. 9.

Referring to FIGS. 10 and 15, an etching process may be performed using a mask pattern 300 as an etching mask. For example, a wet etching process may be performed. For example, a wet etching process may be performed using a hydrofluoric acid (HF) aqueous solution. Accordingly, a portion of the pre-inserted insulating film 290p may be removed to form a fourth trench t4 and the inserted insulating film 290 may be formed.

The fourth trench t4 may expose a portion of the inserted insulating film 290. The fourth trench t4 may be recessed toward the inserted insulating film 290. A bottom face of the fourth trench t4 may be convex toward the inserted insulating film 290. This may be due to the wet etching process.

Subsequently, referring to FIG. 14, the mask pattern 300 may be removed. The interlayer insulating film 280 may be formed.

Figure 16:
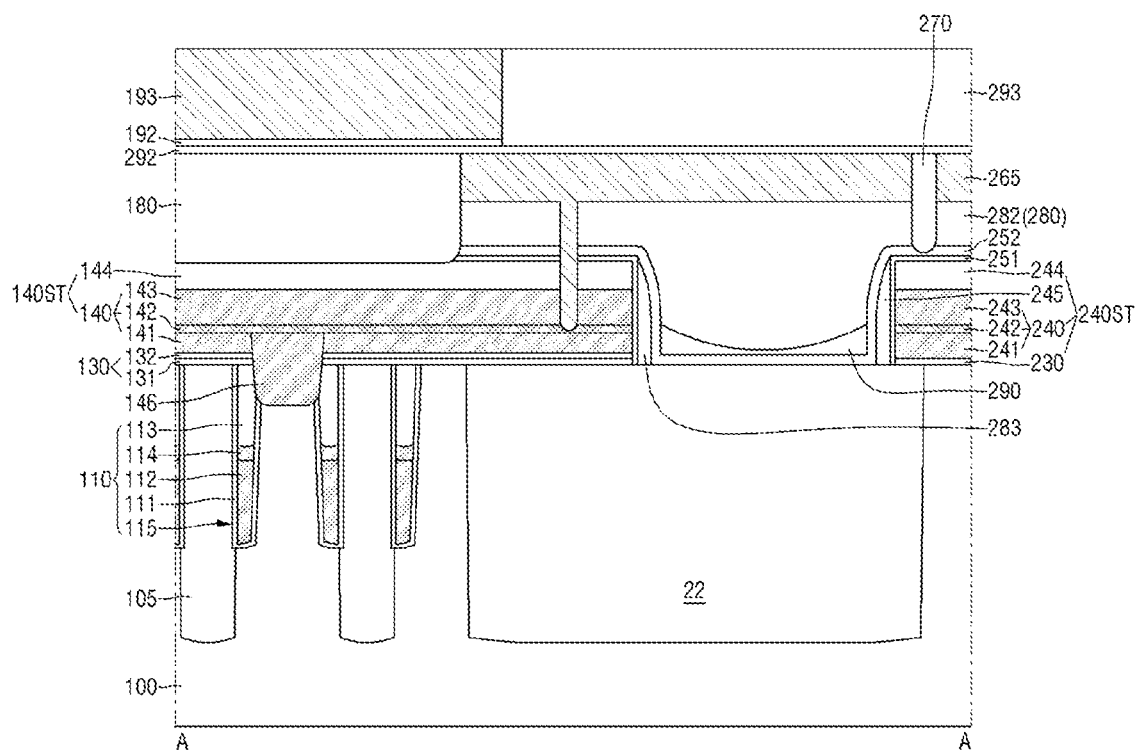
FIG. 16 is a diagram for illustration of a semiconductor device according to some implementations.

FIG. 16 is a diagram for illustration of a semiconductor device according to some implementations. For the convenience of illustration, following descriptions are centered on differences from those described using FIG. 14.

Referring to FIG. 16, in a semiconductor device according to some implementations, the inserted insulating film 290 and the interlayer insulating film 280 may be sequentially stacked on a portion of the second etching stopper film 252 between the bit-line structure 140ST and the peripheral gate structure 240ST. The inserted insulating film 290 and the interlayer insulating film 280 may fill a space defined on the second etching stopper film 252 and between the bit-line structure 140ST and the peripheral gate structure 240ST.

A bottom face of the interlayer insulating film 280 at which the interlayer insulating film 280 and the inserted insulating film 290 contact each other may be convex toward the substrate 100.

Figure 17:
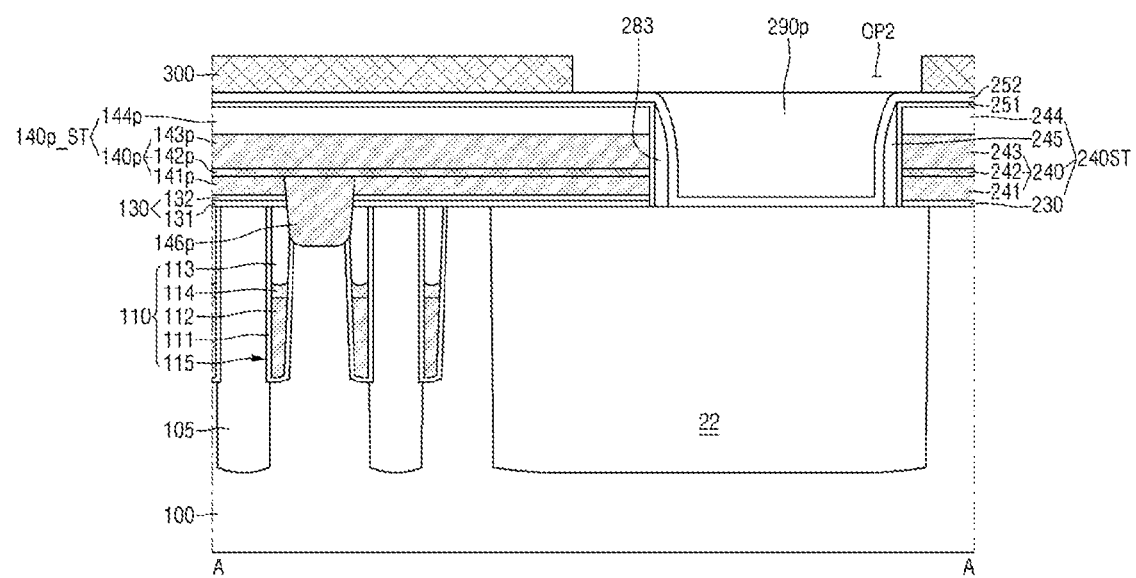
FIG. 17 and FIG. 18 are diagrams of intermediate structures for illustration of a semiconductor device manufacturing method according to some implementations.
Figure 18:
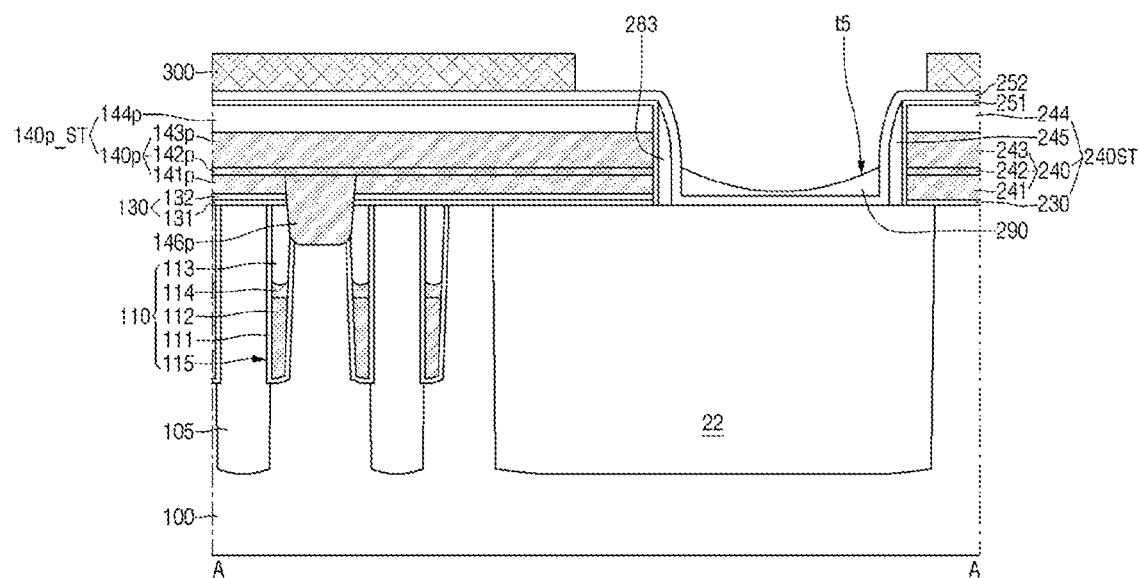

FIG. 17 and FIG. 18 are diagrams of intermediate structures for illustration of a semiconductor device manufacturing method according to some implementations. Descriptions duplicate with those described using FIG. 9 to FIG. 13 are briefly described or omitted.

For reference, FIG. 17 may be a drawing subsequent to the process of FIG. 9. The cell spacer 283 in FIG. 17 may correspond to the sacrificial spacer 281p in FIG. 10.

Referring to FIG. 17, a mask pattern 300 including a second opening OP2 may be formed on the second etching stopper film 252. The second opening OP2 may expose a portion of a top face of the second etching stopper film 252 on the cell conductive film structure 140p_ST and the cell spacer 283, and an entirety of a top face of the pre-inserted insulating film 290p. The second opening OP2 may expose at least a portion of the second etching stopper film 252 on the peripheral gate structure 240ST. However, the present disclosure is not limited thereto. The second opening OP2 may not expose the second etching stopper film 252 on the peripheral gate structure 240ST.

Referring to FIG. 18, an etching process may be performed using the mask pattern 300 as an etching mask. For example, a wet etching process may be performed. For example, a wet etching process may be performed using a hydrofluoric acid (HF) aqueous solution. Accordingly, the top face of the pre-inserted insulating film 290p may be recessed to form a fifth trench t5 and the inserted insulating film 290 may be formed.

The fifth trench t5 may expose an entirety of a top face of the inserted insulating film 290. The fifth trench t5 may be recessed toward the inserted insulating film 290. A bottom face of the fifth trench t5 may be convex toward the inserted insulating film 290. This may be due to the wet etching process.

Subsequently, referring to FIG. 16, the mask pattern 300 may be removed, and the interlayer insulating film 280 may be formed.

Figure 19:
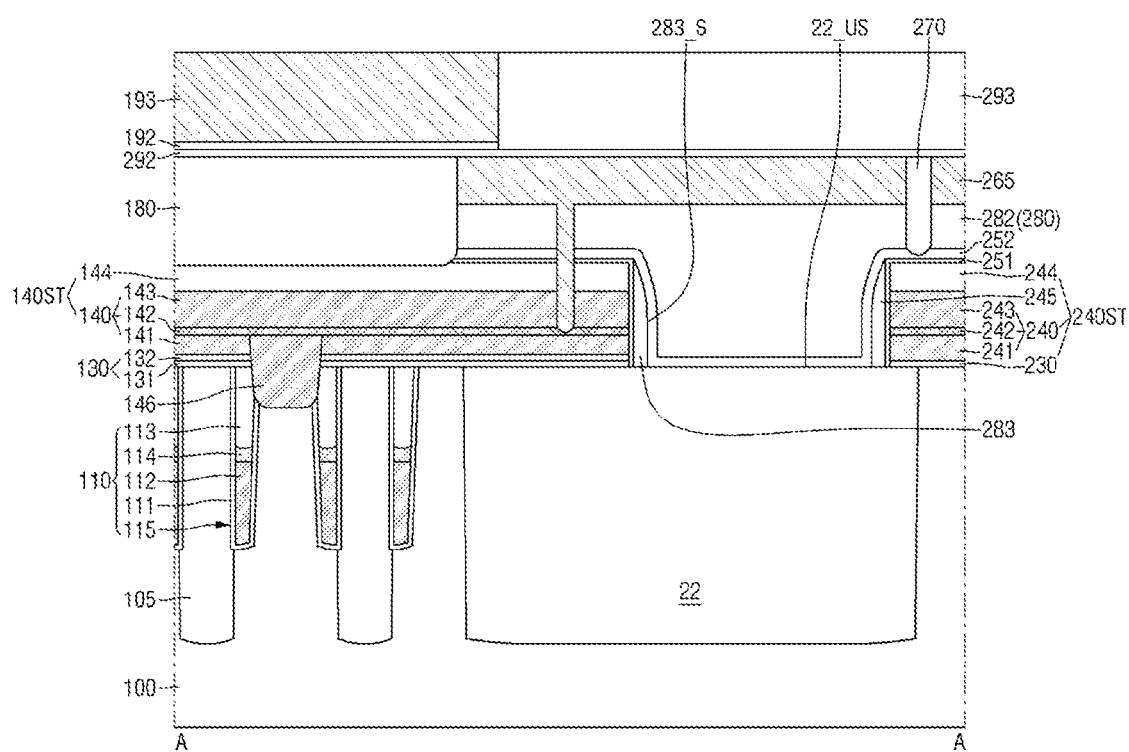
FIG. 19 is a diagram for illustration of a semiconductor device according to some implementations.

FIG. 19 is a diagram for illustration of a semiconductor device according to some implementations. For convenience of illustration, following descriptions are based on differences from the description using FIG. 16.

Referring to FIG. 19, a semiconductor device according to some implementations may not include the inserted insulating film (290 in FIG. 16). The interlayer insulating film 280 may cover an entirety of the second etching stopper film 252. Accordingly, the interlayer insulating film 280 may fill a space defined on the second etching stopper film 252 and between the bit-line structure 140ST and the peripheral gate structure 240ST.

Figure 20:
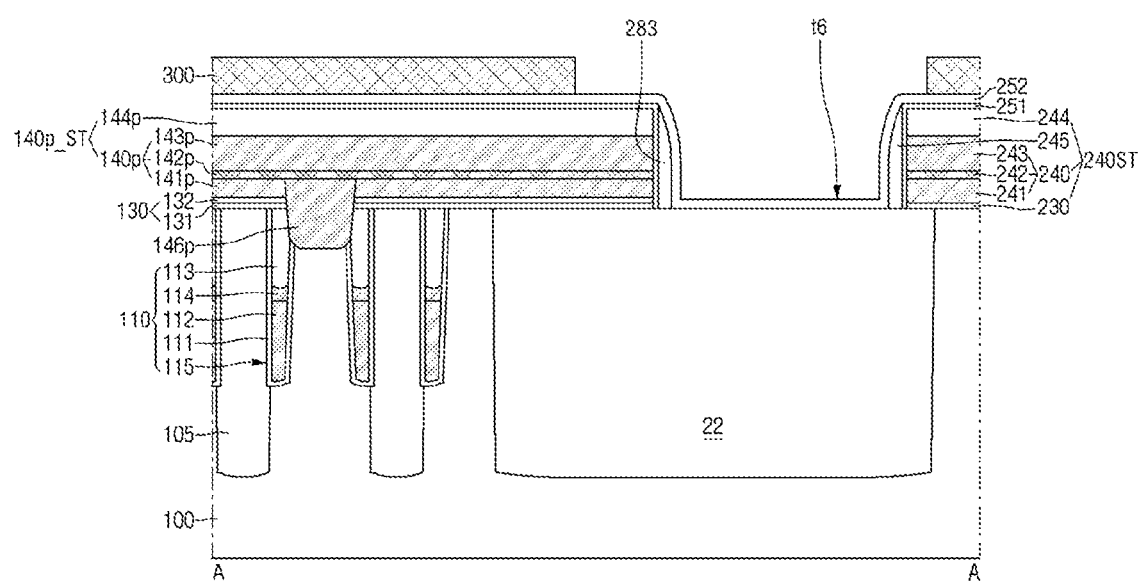
FIG. 20 is a diagram of an intermediate structure to illustrate a semiconductor device manufacturing method according to some implementations.

FIG. 20 is a diagram of an intermediate structure to illustrate a semiconductor device manufacturing method according to some implementations. Descriptions duplicate with those described using FIG. 9 to FIG. 13 are briefly described or omitted.

For reference, FIG. 20 may be a drawing subsequent to the process of FIG. 17.

Referring to FIG. 17 and FIG. 20, an etching process may be performed using a mask pattern 300 as an etching mask. For example, a dry etching process may be performed. Accordingly, the pre-inserted insulating film 290p may be removed to form a sixth trench t6. The sixth trench t6 may be defined by the second etching stopper film 252 and on the cell region isolation film 22.

Although embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, embodiments disclosed in the present disclosure are not intended to limit the technical idea of the present disclosure, but to describe the present disclosure. The scope of the technical idea of the present disclosure is not limited by embodiments. Therefore, it should be understood that embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A semiconductor device comprising:
a substrate comprising a cell region;
a cell region isolation film in the substrate and extending along an outer edge of the cell region;
a bit-line structure on the substrate and in the cell region, wherein the bit-line structure has a distal end positioned on the cell region isolation film;
a cell spacer on a vertical side surface of the distal end of the bit-line structure;
an etching stopper film extending along a side surface of the cell spacer and a top face of the cell region isolation film; and
an interlayer insulating film on the etching stopper film, and on the side surface of the cell spacer, wherein the interlayer insulating film comprises silicon nitride.

2. The semiconductor device of claim 1, further comprising:
an inserted insulating film on the cell region isolation film, and on a side surface of the interlayer insulating film, wherein the inserted insulating film comprises a material different from a material of the interlayer insulating film.

3. The semiconductor device of claim 2, wherein the inserted insulating film comprises silicon oxide.

4. The semiconductor device of claim 2, wherein the substrate further comprises a peripheral area along a periphery of the cell region and the semiconductor device further comprises a peripheral gate structure on the substrate and in the peripheral area,
  wherein the interlayer insulating film extends along a top face of the inserted insulating film and a top face of the peripheral gate structure,
  wherein the inserted insulating film is between the peripheral gate structure and the interlayer insulating film.

5. The semiconductor device of claim 1, wherein the bit-line structure comprises a first portion and a second portion including the distal end,
  wherein a top face of the second portion is lower than a top face of the first portion relative to the substrate.

6. The semiconductor device of claim 1, wherein the cell spacer comprises silicon nitride.

7. The semiconductor device of claim 1, wherein the cell spacer comprises a material different from a material of the interlayer insulating film.

8. The semiconductor device of claim 1, further comprising:
  a cell insulating film between the substrate and the bit-line structure and disposed in the cell region,
  wherein a distal end of the cell insulating film protrudes from the distal end of the bit-line structure.

9. The semiconductor device of claim 1, further comprising:
  a cell insulating film between the substrate and the bit-line structure and disposed in the cell region,
  wherein the distal end of the bit-line structure protrudes from a distal end of the cell insulating film.

10. The semiconductor device of claim 1, wherein the substrate further comprises a peripheral area along a periphery of the cell region and separated therefrom by the cell region isolation film, and the semiconductor device further comprises:
  a peripheral gate structure on the substrate and in the peripheral area; and
  a peripheral spacer on the cell region isolation film, wherein the peripheral spacer is between the cell spacer and the peripheral gate structure.

11. The semiconductor device of claim 10, further comprising:
  an inserted insulating film between the cell region isolation film and the interlayer insulating film,
  wherein the inserted insulating film comprises a material different from silicon nitride, and
  wherein a bottom face of the interlayer insulating film is in contact with the inserted insulating film and is convex toward the inserted insulating film.

12. A semiconductor device comprising:
  a substrate comprising a cell region and a peripheral area along a periphery of the cell region;
  a cell region isolation film in the substrate and extending along an outer edge of the cell region;
  a bit-line structure on the substrate and in the cell region, wherein the bit-line structure has a distal end positioned on the cell region isolation film;
  a peripheral gate structure on the substrate and in the peripheral area;
  an interlayer insulating film on the cell region isolation film and on the distal end of the bit-line structure; and
  an inserted insulating film on the cell region isolation film, wherein the inserted insulating film is between the interlayer insulating film and the peripheral gate structure,
  wherein a side surface of the interlayer insulating film in contact with the inserted insulating film is convex toward the inserted insulating film.

13. The semiconductor device of claim 12, wherein the interlayer insulating film comprises a material different from a material of the inserted insulating film.

14. The semiconductor device of claim 12, further comprising:
  a cell spacer on a vertical side surface of the distal end of the bit-line structure; and
  an etching stopper film extending along a side surface of the cell spacer, a top face of the cell region isolation film, and at least a portion of the peripheral gate structure,
  wherein the inserted insulating film is between the etching stopper film and the interlayer insulating film.

15. The semiconductor device of claim 14, wherein each of the interlayer insulating film and the cell spacer comprises silicon nitride.

16. The semiconductor device of claim 14, wherein the cell spacer comprises an insulating material that is different from an insulating material of the interlayer insulating film.

17. A semiconductor device comprising:
  a substrate comprising a cell region and a peripheral area along a periphery of the cell region;
  a cell region isolation film in the substrate and extending along an outer edge of the cell region;
  a gate electrode comprising at least a portion in the substrate and in the cell region, wherein the gate electrode extends in a first direction;
  a bit-line structure on the substrate and in the cell region, wherein the bit-line structure extends in a second direction intersecting the first direction, wherein the bit-line structure has a distal end on the cell region isolation film;
  a cell spacer on a side surface of the bit-line structure;
  a peripheral gate structure in the peripheral area and on the substrate, wherein the peripheral gate structure is spaced apart from the bit-line structure in the second direction;
  an etching stopper film extending along a side surface of the cell spacer, a top face of the cell region isolation film, and an outer face of the peripheral gate structure; and
  an interlayer insulating film on the etching stopper film and on the side surface of the cell spacer, wherein the interlayer insulating film extends into at least a portion of a space between the cell spacer and the peripheral gate structure, wherein the interlayer insulating film comprises silicon nitride.

18. The semiconductor device of claim 17, further comprising:
  an inserted insulating film separated from the cell spacer by the interlayer insulating film, wherein the inserted insulating film is between the interlayer insulating film and the peripheral gate structure,
    wherein the interlayer insulating film extends along a top face of the inserted insulating film and a top face of the peripheral gate structure.

19. The semiconductor device of claim 17, wherein the interlayer insulating film fills the space between the cell spacer and the peripheral gate structure on the cell region isolation film.

20. The semiconductor device of claim 17, wherein a bottom face of the etching stopper film is lower than a top face of the cell region isolation film relative to the substrate.

* * * * *